United States Patent [19]
Faulkner et al.

[11] 3,950,234
[45] Apr. 13, 1976

[54] METHOD FOR ELECTRODEPOSITION OF FERROMAGNETIC ALLOYS AND ARTICLE MADE THEREBY

[75] Inventors: John P. Faulkner, Thousand Oaks; Dennis S. Morton, Simi Valley, both of Calif.

[73] Assignee: Burroughs Corporation, Detroit, Mich.

[22] Filed: Oct. 29, 1974

[21] Appl. No.: 518,352

[52] U.S. Cl. ..... 204/43 P; 204/DIG. 9; 340/174 TF; 360/131
[51] Int. Cl.² ....................... C25D 3/56; G11C 11/02
[58] Field of Search ...................... 204/43 P, DIG. 9; 340/174 NA, 174 TF; 117/130 E; 106/1; 360/131-136; 29/194, 199

[56] References Cited

UNITED STATES PATENTS

| | | | |
|---|---|---|---|
| 3,152,974 | 10/1964 | Zentner | 204/43 P |
| 3,637,471 | 1/1972 | Faulkner | 204/43 P |

OTHER PUBLICATIONS

V. M. Zhogina et al., Soveschania po Elecktrokhimii, Vol. 3, pp. 40-44 (1961).
M. A. Sanborn et al., IBM Tech. Disclosure Bulletin, Vol. 6, No. 6, p. 4, Nov. 1963.

*Primary Examiner*—G. L. Kaplan
*Attorney, Agent, or Firm*—Christie, Parker & Hale

[57] ABSTRACT

An electrolytic plating solution and method for depositing ferromagnetic recording films therefrom is described. The plating solution has cobaltous ion in the range of from about 3 to 15 grams per liter, nickelous ion in the range of from about 30 to 50 grams per liter, and orthophosphite ion in the range of from about 3 to 12 grams per liter. It is important that the ratio of nickelous ions to cobaltous ions be in the range of from about 3:1 to about 15:1. The plating solution is substantially free of hypophosphite ion, phosphate ion, copper and iron so that phosphite ion is the sole source of phosphorus. Optionally the solution may contain up to about 30 grams per liter of boric acid and up to about 25 grams per liter of formate ion. The pH of the solution is maintained in the range of from about 3.5 to 4.7. Plating is conducted with either direct current or pulsed direct current at a current density in the range of from about 10 to 120 amperes per square foot and at a temperature in the range of from about 70 to 140°F. Coercivity and retentivity of the electrodeposited coating can be independently controlled over a very wide range of values by control of the several variables of composition, temperature, pH, etc. in a complex multivariant system. The hysteresis loop has a high degree of "rectangularity."

33 Claims, 3 Drawing Figures

METHOD FOR ELECTRODEPOSITION OF FERROMAGNETIC ALLOYS AND ARTICLE MADE THEREBY

BACKGROUND

MAGNETIC

It is quite well known to record various types of information, either analog or digital, on apparatus employing ferromagnetic coatings on structures in a variety of forms such as tape, disks, drums, and the like. In these structures a ferromagnetic coating is applied as a thin film on a non-ferromagnetic substrate. A broad variety of such magnetic coatings have been developed and used. The magnetic characteristics of the coating determine the type and amount of information of a given type which may be magnetically recorded thereon.

Digital computers handle large amounts of information at high speeds and this information is coded in binary form which may be recorded on a ferromagnetic coating on a disk, tape, or drum. Each individual piece of binary information in a digital computer is identified as a "bit" and these bits are generally recorded in tracks which are produced by the passage of a magnetic recording head over the surface of the coating. A large number of tracks may be arranged parallel to each other on the recording medium. The tracks are not physical structures isolated from each other but are identifiable magnetic regions in a continuous film. The number of bits per square inch which may be recorded on a ferromagnetic coating is an important factor in determining the size and cost of recording equipment. The trend for several years has been towards higher and higher density recording.

Since, in the design of magnetic recording equipment, there are mechanical considerations not associated with the characteristics of the ferromagnetic coating which place minimal limitations on the width of each recording track and the distance between tracks it has become customary to specify the recording density as the number of bits recorded per linear inch of track, commonly stated as "bits per inch".

The "bit length" (inches per bit) is the reciprocal of the bit density in a magnetic recording film. Transfer rate refers to the number of bits of information transferred to or from the magnetic recording medium by the recording apparatus. Typically the units are thousands or millions of bits per second. The bit period (seconds per bit) is the reciprocal of the transfer rate. Thus, for example, in a system recording at a bit density of 10,000 bits per inch and at a transfer rate of 10 megabits per second, the bit length is 100 microinches and the bit period is 100 nanoseconds.

The magnetic characteristics of a ferromagnetic coating for recording digital information are highly important in determining the maximum number of bits per inch which may be recorded and intelligibly reproduced or "read". The recording density is markedly influenced by the form of the hysteresis loop which is characteristic of the coating as well as by the coercivity and retentivity of the coating.

FIG. 1 illustrates the general form of the hysteresis loop of a ferromagnetic material such as is useful in thin film recording devices. The hysteresis loop is a plot of the directed intensity of magnetization B of the material as a function of the directed magnitude of the external magnetizing field H. Initially, before being subjected to a magnetizing influence, a ferromagnetic film or the like has an inherent magnetization very near or at the origin of the graph of FIG. 1. After being subjected to magnetization the material will have a residual magnetization at any point on or within the hysteresis loop depending on its previous magnetic history. In recording devices it is usual that the intensity of external magnetizing is sufficient to saturate the magnetic material and the magnetization B lies on the line forming the loop.

Assume that because of prior magnetic history the initial state of magnetization of a ferromagnetic material is $B_r^-$. That is when the external magnetizing field H is zero, the ferromagnetic film has a residual intensity of magnetization of $B_r^-$. As the applied magnetic field H increases in the $H^+$ direction to a value equal to or greater than $H_s^+$ the value of B will vary in accordance with the lower curve to a value of $B_s^+$. The field intensity $H_s$ is the saturation field at which all of the magnetic domains which can be oriented by the field have been so oriented. Further increase in the value of H will not result in any increase in the value of B. When the value of the magnetic field is reduced to zero after having attained saturation $H_s^+$ the value of B in the ferromagnetic material varies in accordance with the upper curve to $B_r^+$. That is, when the magnetic field is completely removed there is a residual intensity of magnetization in the ferromagnetic material of $B_r^+$.

When the field intensity of magnetization is increased in the opposite direction, that is, towards $H^-$, the intensity of magnetization B in the ferromagnetic material follows along the upper curve until a saturation value of $B_s^-$ is reached and further increases in magnetic field intensity will not increase the magnetization of the material. When the magnetic field is again reduced to zero the intensity of magnetization in the ferromagnetic materials follows the lower curve in FIG. 1 to return to the initial state of magnetization $B_r^-$.

The hysteresis loop is symmetrical about the origin and the signs of B and H are arbitrary. The value of $B_r$ when field H is zero is known as retentivity or maximum remanence and has units of Gauss. The value of field $H_c$ needed to bring magnetization to zero is known as coercivity and the units are Oersteds.

The value obtained by dividing the residual intensity of magnetization or retentivity $B_r$ by the saturation magnetic intensity $B_s$ is a measure of how well the magnetic domains in the ferromagnetic material remain oriented when the magnetizing field is reduced to zero after equalling or exceeding the saturation value $H_s$. This value is commonly known as the "squareness ratio" of the hysteresis loop. Generally speaking in a magnetic recording film it is desirable to have a high squareness which indicates that there is a relatively strong residual magnetization in the film after recording. Squareness ratios in the order of about 0.75 to 0.90 have been considered acceptable for thin film magnetic recording devices.

Characteristics of the hysteresis loop other than squareness, coercivity and retentivity are involved in determination of the suitability of a ferromagnetic coating for use as a digital recording medium at very high bit densities. Recording densities of 5000 bits per inch are employed in some commercially available equipment and densities exceeding 10,000 bits per inch may be practical. Transfer rates of millions of bits per second may be used in disk memories.

Referring again to FIG. 1 it will be noted that the variation of B with H is non-linear as H is increased from zero to saturation $H_s$. The great majority of the magnetic domains are switched as H increases from $H_1$ to $H_2$. As the angles $\alpha$ and $\beta$ as shown in FIG. 1 approach 90° and the instep radius $R_1$ and knee radius $R_2$ approach zero, the range of values of the magnetizing field H over which the magnetic state of the ferromagnetic coating is appreciably affected steadily decreases. The limit of this variation is the perfectly rectangular hysteresis loop illustrated in FIG. 2. As pointed out hereafter the closer one can approach such a rectangular loop the better the recording film is for recording high bit densities. To avoid confusion with the commonly employed term "squareness" this characteristic of hysteresis loops will be referred to herein as "rectangularity". So far as is known, this term has not previously been employed with respect to magnetic hysteresis loops.

In one type of system for recording digital information known as the non-return-to-zero (NRZ) saturation mode, "ones" are recorded by applying a magnetizing field having an intensity greater than $H_s$ in one direction and "zeros" are recorded by applying a field of equal intensity in the opposite direction. That is, on the recording medium, the bits having a value of 1 are represented by an intensity of magnetization of $B_r^+$ and the bits having a value of 0 are represented by a state of magnetization of $B_r^-$.

A consecutive series of ones or zeros is recorded by maintaining the saturation field of the recording head in the appropriate direction for the required number of bit periods. When the value being recorded changes from zero to one or vice versa, the magnetic polarization of the recording head is reversed, thereby reversing the magnetic polarization of the ferromagnetic coating. This reversal of polarization is called a transition and the length of the transition along the recording track exerts a pronounced influence on the form of the electrical signal reproduced by the reading head as it passes over the transition.

In modern digital recording apparatus the relative velocity between the recording head and the ferromagnetic coating may be as great as several thousand inches per second. The reading heads, of course, have similar relative velocities. Such velocities may be obtained, for example, by a stationary head and a rapidly rotating disk or drum. Reversal of the magnetizing field produced by the recording head is accomplished by reversing the direction of flow of an electric current through the winding of the head. This reversal of polarity requires a small but finite period of time. During this short period successive increments of coating along the recording track are subjected to magnetic fields of every value between the saturation magnetizing field $H_s$ in one direction and the saturation field $H_s$ in the other direction. It will be apparent that as the rectangularity of the hysteresis loop increases, the range of magnetizing field intensities which appreciably affect the magnetic state of recording film decreases. This, of course, reduces the transition length and with a perfectly rectangular hysteresis loop the transition length will be governed solely by the rates of current change possible in the electronic equipment and recording head. Reduction of the transition length that must be accounted for between adjacent bits makes available more space for the bit information itself and short transition lengths are highly important for high bit densities.

As the reading head passes over the magnetic transition on the recording film the magnetic gap in the head cuts the magnetic flux field emitted by the transition, thereby inducing an electric current in the winding of the rear head. The electric signal generated in the head is proportional to the first derivative of the flux density as a function of time, d $\Phi$/dt. That is, as the length of the transition is reduced the resultant signal amplitude will increase. Thus, for a given signal output the energy product, retentivity times coercivity ($B_r \times H_c$), can safely be decreased as the rectangularity of the hysteresis loop is increased. Generally it has been considered desirable to have the area of the hysteresis loop relatively large, that is, have a large energy product so that the magnetic recording medium retains more energy. The retention of more energy implies that more energy is applied in the course of reversing the polarity of magnetization in the film. This, of course, requires application of more energy to the recording head. Increasing rectangularity of the hysteresis loop with resultant higher signal amplitude minimizes the desirability of a large energy product, thereby relaxing the energy requirements of the electronics and recording heads. A substantial energy product is, of course, still desirable to minimize the influence of stray demagnetizing effects.

The many transitions within a recording medium induce a general demagnetizing field which tends to increase the transition length. It is generally recognized that the transition length tends to be increased by increasing retentivity $B_r$ and decreased by increasing coercivity $H_c$. An increase in coercivity requires a greater magnetizing field to saturate the ferromagnetic recording medium and hence complicates the problem of designing recording heads and electronics for operation at high transfer rates. However, the decrease in energy product which becomes permissible with increased rectangularity of the hysteresis loop permits a decrease in the retentivity of the coating. Increased rectangularity of the hysteresis loop provides an additional advantage in the design of recording systems. With increasing rectangularity the saturation field $H_s$ approaches the coercivity $H_c$ and therefore a recording head which provides a given magnetizing field can record on a coating having greater coercivity.

An important property of a magnetic recording film is the attenuation ratio at high bit densities. The attenuation ratio as used herein is the ratio of the readback signal amplitude at low bit density divided by the readback signal amplitude at high bit density. Such a measurement is made, for example, by recording a train of signals at a bit density of 800 bits per inch. The train of signals is then read in a conventional manner and the signal amplitude measured. The same procedure is followed by recording data on the medium at a bit density of say 5000 bits per inch and then measuring the readback signal amplitude as this data is read. Losses of signal amplitude due to either or both the recording or reading processes show up as an increase in the attenuation ratio over the optimum value of 1 which indicates that the film is as suitable for high bit densities as it is for low.

Processes for forming ferromagnetic coatings for use as recording media in apparatus employing high bit densities and high transfer rates should provide coatings which exhibit hysteresis loops having a high order of rectangularity. That is, the instep radius $R_1$ and the knee radius $R_2$ should both be small and the angle $\alpha$ (FIG. 1) should approach 90°. Recording heads and the electronics for magnetic recording systems are designed for use with recording media having predetermined values of retentivity and coercivity. It is therefore highly desirable to be able to predict these magnetic properties of a coating. It is desirable to control the coercivity and retentivity of the magnetic coating material over a broad range of values for design and use of systems having a variety of applications. Preferably the coercivity and retentivity should be independently controllable so that coatings can be provided with any desired properties.

CHEMICAL

Over the past twenty years a considerable effort has been devoted to improving the magnetic characteristics of ferromagnetic metal coatings for application in recording binary coded information for digital computers. There has been a continuing trend towards higher transfer rates and higher bit densities. So far as is known no particular attention has been paid to the rectangularity of the hysteresis loop exhibited by the deposits. The only values of magnetic properties reported in patents and technical papers are the squareness $B_s/B_r$, the coercivity $H_c$, the retentivity $B_r$ and the energy product BH (actually energy product is best stated as Hdb). These properties have been reported for coatings resulting from the codeposition of cobalt and phosphorus, or cobalt, nickel and phosphorus by a variety of processes. With rare exception these processes have employed hypophosphite ions as the sole source of phosphorus in the electrolyte solution.

The phenomenon of electrocodeposition of phosphorus with cobalt and with nickel was disclosed by Brenner, et al. in U.S. Pat. No. 2,643,221, and also in National Bureau of Standards Research Paper RP 2061 in the *Journal of Research of the National Bureau of Standards*, Volume 44, Page 109 (January, 1950). Brenner, et al. disclose electrodeposition of alloys of phosphorus with nickel from electrolyte solutions incorporating nickel as the chloride and sulphate and/or as phosphite. Alloys of cobalt and phosphorus are deposited from baths incorporating cobalt as chloride and/or phosphite. The electrolyte solutions incorporating the plating metals only as the phosphite contained no other active anions, and an excess of one mole per liter of phosphorous acid so that the pH was in the range of about 0.5 to 1.0. In those electrolyte solutions wherein the metals were present as compounds other than phosphites, orthophosphoric acid was included as well as orthophosphorous acid so that both phosphite and phosphate ions were present.

Brenner, et al. also discclose electrodeposition of an alloy of cobalt and phosphorus from an electrolyte solution incorporating cobalt chloride, formic acid, or hydroxyacetic acid and orthophosphorous acid at a pH in the range of about 1.5 to 2.0. In all cases the temperatures were in the range of 75 to 95°C. (167 to 203°F). The importance of pH and temperature is highly stressed by Brenner, et al. and it is reported that difficulties are observed if the pH is much about 1 or the temperature below about 75° C. Brenner, et al. were not concerned whatsoever with the magnetic properties of the coatings obtained. Brenner, et al. only mention that cobalt phosphorus alloys containing up to 10% phosphorus were attracted by a magnet and that nickel phosphorus alloys containing more than about 8% phosphorus were not attracted.

Zentner disclosed in Plating, September, 1965, Page 869 that with direct plating current, the coercivity of the alloys deposited by the method of Brenner, et al. increased with current density. Even with the current density of 250 amperes per square foot the coercivity was less than 200 oersteds. Both cobalt and cobalt nickel baths were investigated both with phosphorous and phosphoric acid. Temperatures were high and the pH was as low as 0.8 to 1.1.

In U.S. Pat. No. 3,152,974, Zentner also disclosed codeposition of cobalt and phosphorus from a bath containing 50 to 100 grams per liter dissolved cobalt and 5 to 20 grams per liter phosphorous acid. Other electrolyte compositions also included phosphoric acid. Cobalt, nickel and phosphorus were codeposited from electrolyte solutions having 50 to 100 grams per liter of cobalt, 50 to 100 grams per liter of nickel, and 5 to 20 grams per liter of phosphorous acid. Other baths also included phosphoric acid. The highest pH reported for any bath is 1.4. Direct current densities of 100 to 250 amperes per square foot had a superimposed alternating current and the cathode was rotated at between 50 and 200 rpm. Coercivities of 800 to 900 oersteds and retentivities of 7000 to 8000 gauss reported.

In the Plating article Zentner further discusses varying the direct and alternating currents and reports production of coatings having coercivities between about 50 and 800 oersteds. No mention is made of independent variation of the coercivity and retentivity and no reference is made to the form of the hysteresis loop exhibited by the coatings.

Sanborn and Overfield report in *IBM Technical Disclosure Bulletin*, Vol. 6, No. 6, November 1963, a cobalt-nickel-phosphorus codeposition bath. This bath has about 12.4 grams per liter nickel ion, 4.9 grams per liter cobalt ion and a little less than one gram per liter of phosphite ion. The bath pH is in the range of 4.0 to 4.5. Films electrodeposited from this bath have a coercivity in the range of from 320 to 400 oersteds, a retentivity of about 500 gauss and a squareness of about 0.75. Coercivity is said to change with pH but the direction of change is unstated.

In my U.S. Pat. No. 3,637,471, there are disclosed methods for electrodeposition of alloys of cobalt and phosphorus and of cobalt, nickel and phosphorus from electrolyte solutions containing the metals as sulfates with hypophosphite and phosphite ions as sources of phosphorus. Approximately equal concentrations of nickel and cobalt are provided in these solutions and the ratio is in the range of about 0.95 to 1.15 moles of nickel per moles of cobalt; pH is in the range of about 3.2 to 5.0; and the temperature for plating is in the range of from about 90° to 140° F. Current density is about 10 to 20 amperes per square foot.

As disclosed therein when pH, temperature, and current density are maintained within reasonably narrow ranges the coercivity of the deposit is controlled by the concentrations of phosphite and hypophosphite ions in the solution. Formate ions and boric acid are also present in the solution. The retentivity of the deposit increased with increasing concentration of formate ions in the solution, and thus was subject to control somewhat independently of coercivity. The squareness of the hysteresis loop exhibited by the coatings produced by this process was about 0.85 to 0.90.

It is now known that the rectangularity of the hysteresis loop of materials deposited according to this process is reasonable but not sufficient for extending capabilities much about about 3,500 bits per inch at transfer rates not exceeding about 3.5 megabits per second. As with all other ferromagnetic coatings the capability of recording at these higher bit densities was achieved by increasing the coercivity of the coating.

The rectangularity of the hysteresis loop characteristic of a particular ferromagnetic coating, as well as the coercivity and retentivity values obtained from the hysteresis loop is now known to be critical in determination of the suitability of the coating for application as a very high density binary recording medium. The hysteresis properties of a ferromagnetic film arise from the metallurgical and magnetic structures of the film as well as its chemical composition. Ferromagnetic coatings which are suitable for application as high density binary recording media are far more than simple electrodeposits of stated compositions. The magnetic and metallurgical structure is very difficult to determine and does not serve to adequately define the coating.

The need for ferromagnetic films exhibiting hysteresis loops having high degrees of rectangularity as well as predetermined values of coercivity and retentivity has not previously been recognized for application in high density digital recording media. There is presently no organized body for knowledge from which processes for deposition of coatings having high rectangularity and controlled coercivity and retentivity can be made. This principle was well stated by Zentner in U.S. Pat. No. 3,152,974:

> "Also, the general principles governing the performance of magnetic materials produced by prior art methods are of little theoretical help in connection with the development of improved magnetic coatings. There exists no general, unified theory or hypothesis embracing the large amount of empirical data which would enable an electrochemist to predict, with even some degree of certainty, the magnetic properties of electrodeposits produced by the use of a chosen set of electrodeposition conditions. The correlation of conventional and unconventional deposition variables with magnetic properties is investigated for each electrodeposited metal or alloy in an empirical fashion, as has been the case during the past fifty years, or more."

It is therefore highly desirable to provide compositions and techniques for depositing ferromagnetic films with a high degree of rectangularity and with predetermined coercivity and retentivity. Such films are used in commercial operations involving the plating of large numbers of memory surfaces over long periods of time. The electrolyte baths from which plating is made should be highly stable so that chemical changes do not influence the properties of the coatings or decrease the efficacy of the baths. When stable baths are used, repetitive chemical analysis to adjust bath composition can be greatly minimized.

BRIEF SUMMARY OF THE INVENTION

There is, therefore, provided in practice of this invention according to a presently preferred embodiment an improved aqueous electrolytic plating solution having from about 3 to 15 grams per liter of cobaltous ion, from about 30 to 50 grams per liter of nickelous ion, and about 3 to 12 grams per liter of phosphite ion. The ratio of the nickelous ion to cobaltous ion is in the range of from about 3:1 to 15:1, and the pH is in the range of from about 3.5 to 4.7. The solution is substantially free of phosphate ion, hypophosphite ion, copper and iron. Preferably, the solution has the metals present as the sulfate although a chloride may be acceptable. An excess of sulfate ion up to about 10 grams per liter may optionally be included in the composition for decreasing resistivity of the bath. Similarly formate ion may be present as a pH buffer and boric acid may be present as a cathode buffer. Boric acid, formate ion and excess sulfate ion appear to have little or no effect on the magnetic properties of the film deposited from such a bath. The plating process deposits a film in the range of from about 5 to 25 microinches thickness at a temperature in the range of from about 70° to 140° C. A current density of about 10 to 120 amperes per square foot is used and beneficial results can be obtained using a pulsed direct current.

The process produces a magnetic recording medium having a marked increase in the rectangularity of the hysteresis loop as compared with any coating produced by previously known processes. The process also provides the capability of controlling and predicting the coercivity and retentivity of the recording films over wide ranges of value and with considerable independence. The magnetic parameters are predetermined through control of the concentrations of cobalt, nickel, and orthophosphite ions in the electrolyte, the pH and temperature of the electrolyte and the cathodic current density. Independent control of these variables permits deposition of coatings having wide variations in either coercivity or retentivity, controlled independently of each other.

DRAWINGS

These and other features and advantages of the present invention will be appreciated as the same becomes better understood by reference to the following detailed description of presently preferred embodiments when considered in connection with the accompanying drawings wherein.

DESCRIPTION

Figure 1:
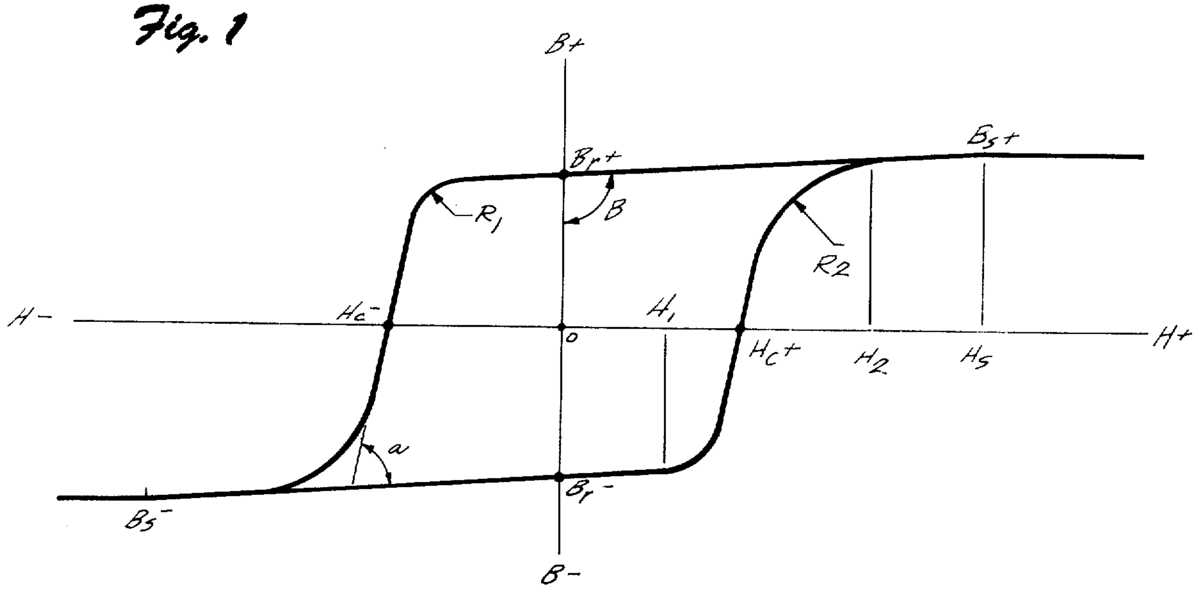
FIG. 1 illustrates a typical hysteresis loop for a magnetic recording film for explanation of the desired manetic properties.
Figure 2:
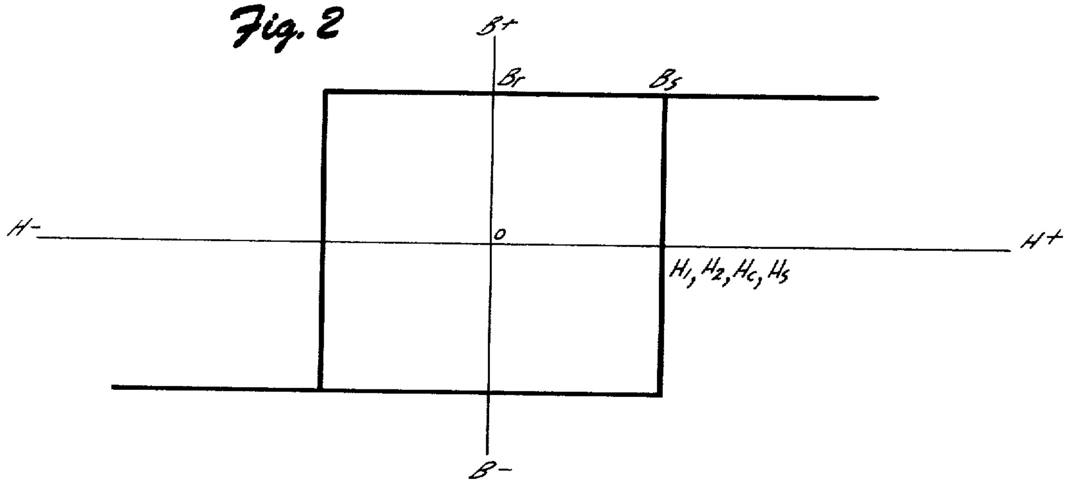
FIG. 2 illustrates a theoretically desirable hysteresis loop for a magnetic recording medium for very high bit density recording.

A principal ingredient in the planting bath is nickelous ion ($Ni^{++}$) which preferably is present in the range of from about 30 to 50 grams per liter. The nickel ion is preferably introduced as high purity nickel sulfate although it appears that nickel chloride is also suitable. As the concentration of metal ion being deposited is reduced in the plating bath the current density for obtaining a uniform coating must also be reduced. The nickelous ion concentration should therefore be greater than about 30 grams per liter so that reasonable current densities can be employed. The nickel ion concentration is preferably no more than about 50 grams per liter so that no possible adverse effects from precipitation are noted.

Preferably, for a magnetic recording film having high rectangularity for binary data recording at a density as high as 10,000 bits per inch, a nickel ion concentration of about 40 grams per liter is employed. A coercivity of about 500 oersteds and a retentivity of about 4000 to 5000 gauss can readily be obtained. The actual coercivity and retentivity are also a function of other parameters as will be clear hereafter.

The electrolyte bath also contains cobaltous ions ($Co^{++}$) in the range of from about 3 to 15 grams per liter. Preferably the cobalt ion is added in the form of cobalt sulfate, although it appears that cobalt chloride may also be suitable in the composition.

It is an important feature of the composition that the concentration of nickel ion to cobalt ion in the solution not be less than about 3:1 nor greater than about 15:1. The cobalt ion concentration should not be less than about 3 grams per liter because of the current density considerations mentioned with respect to nickel ion. If too little cobalt ion is present, the nickel concentration in the resulting coating may be unduly high. The cobalt ion concentration should not be greater than about 15 grams per liter to be consistent with the maximum concentration of nickel ion in the solution. Preferably the cobalt ion is present in a concentration in the range of from about 5 to about 10 grams per liter. In this range one obtains a full spectrum of coercivity and retentivity values of utility in high density recording. It is particularly preferred that the cobalt ion concentration be about 7.5 grams per liter since with such a bath films have been deposited with the capability of recording at densities up to at least 10,000 bits per inch. If the nickel to cobalt ratio is outside the range of from about 3:1 to 15:1 the rectangularity of the deposited film is degraded. Preferably the nickel-cobalt ion ratio is in the range of about 4:1 to 8:1 for most ready control of rectangularity of the hysteresis loop.

The ratio of nickel to cobalt is important so that orthophosphite ions ($H_2PO_3^-$, also called phosphite ion) alone may be employed as the sole source of phosphorus in the solution to deposit alloys of cobalt, nickel and phosphorus having high rectangularity solely by the electrolytic action of plating current. This enables one to eliminate hypophosphite ion as a source of phosphorus with substantially enhanced stability in the electrolyte solution. If the ratio of nickel ion to cobalt ion is less than about 3:1 suitable magnetic coatings deposited with phosphite ion alone as the source of phosphorus are not obtained. Althoug both coercivity and retentivity may increase with decreasing ratio, the desired rectangularity of the coating may not be obtained.

The ratio of nickel ion to cobalt ion in the solution should not exceed about 15:1 or the magnetic properties of the resulting film may suffer from lack of cobalt. Cobalt is highly preferentially deposited from these baths and insufficient amounts may be present if the nickel to cobalt ratio becomes too high. As an example of the preferential deposition it might be noted that an alloy having about ¾ cobalt and ¼ nickel (about about 4% phosphorus) is obtained from a plating bath having over five times as much nickel concentration as cobalt concentration.

As suggested, the plating bath includes orthophosphite (or "phosphite") ion ($H_2PO_3^-$) in the range of from about 3 to 12 grams per liter. The plating bath is free of either hypophosphite or phosphate ion so that phosphite ion is the sole source of phosphorus in the bath. The elimination of hypophosphite ion from the electrolyte appears to cause a marked change in the electrochemical reaction occurring at the cathode as compared with those processes described in my U.S. Pat. No. 3,637,471. In addition to the elimination of hypophosphite ion from baths as described in that patent there are marked differences in the required compositions of cobalt and nickel and in the ratio of the concentration of nickel to the concentration of cobalt to get the desired rectangularity. A change in the discharge potential of the phosphorus species in the solution occurs when hypophosphite ion is eliminated since phosphorus is much more preferentially deposited from it than it is from phosphite ion. This change in discharge potential of the phosphorus species appears to affect the discharge potential of cobalt and probably also of nickel.

These changes are evidenced in several ways. For example, the great increase in rectangularity of the hysteresis loop indicates a change in the magnetic structure of the coating which in turn suggests a change in the metallurgical structure. These structures are not readily determined and chemical analysis alone of the coating is insufficient to define its properties. So far as is known, the coating is definable only by its magnetic properties and process for deposition. Elimination of hypophosphite ion also enables a substantial increase in the ability to independently control coercivity and retentivity of the magnetic film as well as enhance rectangularity. In the plating process disclosed in my U.S. Pat. No. 3,637,471 the influences of temperature, pH and cathodic current density were relatively small and so it was feasible to hold these parameters at set values and adjust the coercivity of the deposit over a wide range by adjusting the relative concentrations of the two phosphorus species in the electrolyte solution. The retentivity was to some degree controllable through the concentration of formate ions in the solution.

In practice of the present invention there are a number of influences due to solution composition and operating conditions, which have a sufficient effect on the magnetic properties of the deposited coating to permit their use to adjust the values of coercivity and retentivity over wide ranges with considerable independence. This is a consequence of elimination of hypophosphite ion from the bath so that phosphite ion is the sole source of phosphorus and also the high ratio of nickel to cobalt ion in the solution.

Phosphite ion is preferably obtained in the bath by way of additions of sodium orthophosphite solution. Sodium orthophosphite solution is typically made by dissolving phosphorous acid in distilled and dionized water and adjusting the pH to approximately the desired pH of the bath by additions of sodium hydroxide. This is preferably done in the absence of the nickel and cobalt ion to prevent precipitation. Alternatively, phosphorous acid can be added directly to the bath, but this results in undue lowering of the pH and neutralization would be needed. The phosphite ion should be in the range of from about 3 to 12 grams per liter. If the concentration is below about 3 grams per liter, the coercivity is lowered to the point that the film is not usable in current high density recording systems. If the concentration of phosphite ion is above about 12 grams per liter the coercivity becomes too high for fast response. This is the case since high flux density is needed for recording on high coercivity films. This would require a high current in the recording head and the response time of the head itself can become limiting. Further, it is noted that rectangularity of the loop may become inferior above about 12 grams per liter phosphite ion concentration. Preferably the phosphite ion is present in the range of from about 7 to 9 grams per liter. In this range it is easy to control coercivity in the range of from about 400 to 600 oersteds and retentivity in the range of from about 4000 to 60000 gauss which is the preferred range for high density recording with current technology.

In this plating bath phosphate ion is essentially inert and does not serve as a source of phosphorus in the coating. Some phosphate accumulates in the bath as a result of oxidation of phosphite ion. With normal production line plating practices, solution drag-out and other losses keep phosphate ion from accumulating to any substantial extent and several years of operation may be conducted without excessive build up of phosphate ion. It appears that five grams per liter of phosphate ion may be present in the bath without any significant effects. There is no deliberate addition of phosphate ion to the bath but no special effort is made to eliminate it as it may accumulate during bath operation.

The pH of the electrolyte is maintained in the range of from about 3.5 to 4.7. Sodium carbonate, sodium bicarbonate, potassium carbonate, nickel carbonate, or sulphuric acid may be added to the bath as required to adjust the pH in the range mentioned. If the pH is below about 3.5 the coercivity falls off rapidly and is too low to be of value for high bit density recording. The coercivity decreases fairly rapidly below about pH 3.8 and preferably the pH is above about 4.0 to keep the coercivity in the best range for high density recording. If the pH is above about 4.7 there is some hazard of precipitation of alkaline salts on the cathode and consequent poor films. The pH is preferably below about 4.5 for best control of magnetic properties.

The bath is quite stable and pH is only checked on a daily basis. The pH tends to drift upwardly and daily adjustments to about 4.5 or slightly below are made. If desired, a sample can be plated and its hysteresis loop checked on a daily basis to detect any changes of significance in the bath. This does not seem to be necessary and a daily pH check suffices. The bath is so stable that other compositions are checked only on a weekly basis. This stability is due to the absence of hypophosphite ion and the sole presence of phosphite ion as the source of phosphorus in the coating.

It is also desirable, although an optional feature, to include formate ion up to about 25 grams per liter to serve as a pH buffer. Typically the formate ion is added in the form of high purity sodium or potassium formate. Since the presence of formate ion in the bath is optional it can be maintained at zero without departing from principles of this invention. The presence of formate ion is beneficial in a practical process because of the ease of control, however, it does not appear to have any substantial effect on the properties of the magnetic film deposited.

Similarly another optional ingredient in the bath is boric acid which may be present up to about 30 grams per liter, or may be completely absent if desired. The boric acid range is, thus, from 0 to about 30 grams per liter. The boric acid is a well known cathode buffer that aids in practical operation of plating baths in production, but it does not appear to have any substantial effect on the properties of the magnetic films deposited.

Another optional ingredient in the bath is an excess of sulfate ions over the amount stoichiometric with the nickel and cobalt. Up to an additional 10 grams per liter of sulfate ion may be present in the bath without detriment. The excess sulfate ion can thus be in the range of from 0 to about 10 grams per liter over stoichiometry. Ordinarily, this is added as sodium or potassium sulfate, although a portion may be present as a result of sulphuric acid additions. The additional sulfate ion increases the conductivity of the bath, thereby minimizing energy requirements and does not appear to have any significant effect on the magnetic properties of the ferromagnetic recording film. If the nickel and cobalt are added as chlorides, an equivalent excess of chloride ion may be present.

The electrolyte used in practice of this invention is a very high purity aqueous solution. Distilled and dionized water is used to avoid accidental introduction of extraneous ions. Reagent grade chemicals are used throughout the processing so that no unwanted ions are introduced. Measures may also be taken to eliminate unwanted materials from the plating solution. Thus, for example, it is found that copper at a concentration greater than about five parts per million in the electrolyte solution significantly degrades the rectangularity of the hysteresis loop which is characteristic of the ferromagnetic coatings deposited in practice of this invention. Clearly copper exerts a marked influence on the magnetic structure of the coating. Copper contamination in the electrolyte solution can readily be reduced to suitable concentrations by "dummy plating" to deposit copper from the bath or by plating a sheet of stainless steel with the ferromagnetic coating and leaving the plated sheet immersed in the circulating electrolyte overnight. Copper preferentially deposits on this coating and is thereby removed from the bath.

It is also found that iron contamination in the electrolyte can reduce the rectangularity of the coating film. The concentration of iron should therefore be maintained below about 5 parts per million. Particles and organic contamination are minimized by continuous filtration and exposure to activated charcoal.

Thus, it is important that the plating bath contain cobaltous ion in the range of from about 3 to about 15 grams per liter, nickelous ions in the range of from about 30 to about 50 grams per liter and phosphite ions in the range of from about 3 to about 12 grams per liter. The ratio of nickel ions to cobalt ions should be in the range of from about 3:1 to about 15:1. Optionally the plating bath may also include from 0 up to about 25 grams per liter of formate ion, from 0 up to about 30 grams per liter of boric acid, and from 0 up to about 10 grams per liter sulfate ion in excess of the amount stoichiometric with the nickel and cobalt. An amount of chloride ion equivalent to sulfate ion may be present. Sodium or potassium ion may also, of course, be present in the bath without any significant effect on the coating. The bath should be free of hypophosphite ion, phosphate ion, copper, and iron. The bath pH is maintained in the range of from about 3.5 to 4.7.

Both temperature and current density have an effect on the magnetic properties of the recording film deposited from the electrolyte. The temperature of the plating bath should be in the range of from about 70 to 140° F. If the plating temperature is less than about 70° F. elaborate cooling systems may be needed and bath resistivity may be increased to the detriment of practical commrcial plating operations. Temperatures higher than about 140° F may have a significant detrimental effect on the rectangularity of the recording films.

Cathodic current density during plating operations should be in the range of from about 10 to 120 amperes per square foot. Generally speaking continuous direct current is suitable. It has been found, however, that under certain conditions as set forth hereinafter, coercivity is increased by plating with the current supplied in a pulsed mode.

As mentioned above, the coercivity of the recording film can be controlled in the range of from about 90 to 800 oersteds by proper selection of plating parameters. Retentivity can be independently controlled in the range of from about 1000 to 7500 gauss. There is no single plating parameter which permits this control over a wide range of two independent variables. Instead there is a multivariant situation that permits one to extrapolate from a known set of parameters and magnetic properties to a new set of parameters that may be desired. When stated in general terms these can only be in the form of trends of the changes that occur since the quantitative amount of the change depends on the totality of parameters in combination. The trends can be stated, however, for one variable at a time. The converse of each following stated trend is, of course, true.

A. A decrease in the ratio of the concentration of nickel ion to the concentration of cobalt ion in the electrolyte solution results in increases of both coercivity and retentivity of the coating.

B. A decrease in the ratio of the concentration of orthophosphite ion to the concentration of cobalt ion in the electrolyte solution results in an increase in the coercivity and a decrease in retentivity of the deposited coating.

C. An increase in the cathodic current density results in a decrease in the coercivity of the coating when the pH of the electrolyte solution is greater than about 4.0, and results in an increase in the coercivity of the coating when the pH of the solution is less than about 4.0. Changes in current density have only minor effects on the retentivity of the coating.

D. An increase in the pH of the electrolyte solution results in increases in both the coercivity and retentivity of the deposited coating.

E. When the pH of the electrolyte solution is less than about 3.7 an increase in the temperature of the solution results in a decrease of both the coercivity and retentivity of the deposited coating. When the pH of the electrolyte solution is greater than about 3.7 an increase in the temperature of the solution results in an increase in the coercivity but has little influence on the retentivity of the deposited coating.

F. It has also been found that the coercivity of the coating, and under some conditions the retentivity of the coating, can be changed while maintaining the high degree of rectangularity of the hysteresis loop by plating with a pulsed current instead of a continuous direct current. These trends are complicated by interrelation with other parameters and are best seen by example.

Samples for this determination were plated with current supplied in pulses of a predetermined number of ampere seconds per square foot of cathode area at a predetermined cathodic density and with intervals of predetermined length. It was found that under certain conditions it is desirable to have current pulses in the range of from about 1.5 to 40 ampere seconds per square foot with time intervals in the range of from 1 to 5 seconds between pulses.

It was found that when the pH, current density, and temperature exceeded the following values coercivity was increased by plating with the current supplied in a pulsed mode as compared with the coercivity of the film with continuous current:

| pH | Temperature | Current Density |
|---|---|---|
| 3.7 | 120° F. | 70 amps/ft$^2$ |
| 3.9 | 120° F. | 50 |
| 4.1 | 90 | 30 |
| 4.2 | 70 | 10 |

When the pH, current density and temperature were less than these values, coercivity was reduced and retentivity was usually reduced by pulsed current. Generally speaking, the maximum increase in coercivity was achieved with current pulses not exceeding about 30 amps/ft$^2$ with intervals between pulses not exceeding about five seconds.

As an example of this technique several samples were plated under identical conditions except for current. The electrolyte solution contained 40 grams per liter of nickelous ion and 10 grams per liter of cobaltous ion, both added as the sulfate. The solution also contained 10 grams per liter of sodium orthophosphite, 10 grams per liter of sodium sulfate, 20 grams per liter of sodium formate, and 30 grams per liter of boric acid. The solution had a pH of 4.1 and temperature at the time of plating was 90° F. A sample plated with a continuous plating current having a cathodic current density of 50 amp/ft$^2$ had a coercivity of 430 oersteds and a retentivity of 5800 gauss. The following data were obtained for samples deposited under the following current conditions:

| Pulse Amp Sec/ft$^2$ | Interval Seconds | Coercivity Oersteds | Retentivity Gauss |
|---|---|---|---|
| 6.0 | 1.0 | 470 | 5300 |
| 6.0 | 2.5 | 530 | 5000 |
| 6.0 | 5.0 | 580 | 4800 |
| 11.0 | 1.0 | 470 | 5600 |
| 11.0 | 2.5 | 480 | 5300 |
| 11.0 | 5.0 | 500 | 5200 |

Other parameters and equipment for the plating process are conventional and may, for example, be as set forth in my U.S. Pat. No. 3,637,471. The anodes employed during electrodeposition may be insoluble such as platinum coated titanium or soluble such as nickel, cobalt, or an alloy of cobalt and nickel. Preferably the anodes are soluble and to minimize electrolyte solution adjustment are preferably an alloy of about 75% cobalt, 25% nickel.

As mentioned above, magnetic properties of the recorded film are very sensitive to contamination of the electrolyte by copper at concentrations of only a few parts per million. Anode bars and other copper sources are therefore coated with suitable maskants. Plating tanks and other elements of the system are preferably coated with maskants to prevent metal contamination in the electrolyte. Plating racks for holding the cathodes are conveniently fabricated of AISI type 316 stainless steel.

The thickness of the coating deposited depends to some extent on the application to which it is to be put and the characteristics of the recording system. Generally speaking, thinner coatings are more suitable for high density recording. It has been determined that, on a suitably prepared metallic substrate, the coating is continuous and quite suitable for magnetic recording at a thickness of 1–2 microinches. The surface should be polished smooth and chemically clean for plating. Conventional activation may be used on some substrates. However, the signal obtained from a film having a thickness in the microinch range is small and, with the electrical noise generated by commercially feasible electronic circuits, the signal-to-noise ratio could be a problem in practical equipment. Future improvements in electronic circuitry may permit thinner films to be used in commercial equipment. For use in conjunction with present electronic circuitry, a thickness not less than about 5 microinches is preferred. A maximum coating thickness of about 25 microinches is sufficient for most magnetic recording purposes, particularly where reasonably high bit densities are involved. When used in conjunction with recording heads and electronic circuits fabricated in accordance with the best current commercial practice, the thickness of the deposited coating is preferably in the range of about 7.5 to 10 microinches. The thinner coating is directly usable as a recording medium at bit densities at least as great as 10,000 bits per inch. The slightly thicker coating permits final polishing which may remove two to three microinches of the coating after deposition. It has been found that, when an extremely smooth surface is required on the magnetic recording medium, it is easier to obtain this finish on the relatively hard magnetic coating than on the relatively softer substrate surface. A typical recording film made in accordance with the principles of this invention having a coercivity of about 500 oersteds and a retentivity of about 5000 gauss, showed an attenuation ratio (signal amplitude at low bit density/signal amplitude at high bit density) of almost exactly 1. This test was performed with a high speed modern recording head and the high bit density was 5000 bits per inch. When the bit density was increased to 10,000 bits per inch, an attenuation ratio of only 1.3 was exhibited, indicating that, due to the high degree of rectangularity of the hysteresis loop, this coating is extremely well adapted to very high density data recording.

EXAMPLES

Electroplating tests were made to establish the trends of magnetic properties as a function of the various plating parameters. A total of 851 tests were made and the results are set forth in Table 1 which is attached hereto as an appendix. The data for all of the tests are tabulated, including some where no useful magnetic data could be obtained. Some of these have combinations of plating parameters near or outside useful limits and others simply represent random experimental discrepancies. Such occansional discrepancies are normal and are not accounted of any significance in analysis of the results. Except as noted in Table 1 all of the tests were conducted in an identical manner.

All of the samples were plated in a plating cell five inches wide and three inches deep. A nickel anode was spaced 6 inches from a Hull cell type brass cathode. A recirculating system for temperature control and bath agitation is connected to the cell and the total system holds four liters of plating solution. The cathode was plated with a width of five inches and a height of 2 and ½ inches. For magnetic tests a 5 inch strip about ⅛ to 1/16 inch wide was sheared from the center portion of the cathode.

Plating baths were made up using reagent grade chemicals and dionized distilled water. Test samples were plated on polished brass Hull cell type substrates to a desired thickness. Plating current, and hence current density, was controlled by highly accurate electronic controls. The time of plating, whether continuous or pulsed, was controlled by electronic timers. Samples plated under the conditions set forth in Table 1 were subjected to conventional magnetic testing and the hysteresis loop produced was displayed on an oscillograph. Loop analysis was made on the basis of photographs of the hysteresis loop with a scale of about 1½ inch equalling 1000 oersteds and 1½ inch equalling 10,000 gauss.

Table 1 sets forth the data obtained arranged according to increasing retentivity BY and analysis of the hysteresis loop as a primary sorting. Within that field of sorting the data are tabulated in order of increasing coercivity HC. That is, in Table 1 for a given retentivity the best loop analysis is tabulated first. When several runs have the same retentivity and loop analysis, the data are tabulated in order of increasing coercivity.

The first column in Table 1 headed "TKNS" is the thickness of deposited film in microinches. This thickness is determined by automatic electronic integration and control of the current density-time integral with allowance for cathode current efficiency, rather than being measured for each film and is considered quite accurate. Cathode current efficiency was considered 90% which has previously been demonstrated correct for these plating conditions.

The second column in Table 1 headed "CO" is the cobaltous ion concentration in grams per liter. Cobalt was added to the bath in the form of cobalt sulfate. Nickelous ion was present in all tests at a concentration of 40 grams per liter and was added as nickel sulfate.

The third column in Table 1 headed "ADD." is the quantity of sodium phosphite included in the bath, stated in grams per liter. Each bath also included 20 grams per liter of sodium formate as a pH buffer, 20 grams per liter of boric acid as a cathode buffer and 10 grams per liter of sodium sulfate for increasing the electrical conductivity of the bath.

The next column in Table 1 states the pH of the bath. The fifth column of Table 1 states the bath temperature "T" in degrees F.

The next three columns in the Table state the current conditions for the test. The current density is stated in the column headed "CD" in units of amperes per square foot. The column headed "P" is the pulse length and the column headed "PD" is the time interval between pulses, both stated in seconds. In some instances there are no extries in the "P" and "PD" columns, indicating that the plating was done with continuous current for a sufficient time to yield the desired thickness.

Thus, for example, the first entry in Table 1 represents a bath having a cobaltous ion concentration of 10 grams per liter, nickelous ion concentration of 40 grams per liter, sodium phosphite concentration of 15 grams per liter, sodium formate concentration of 20 grams per liter, boric acid concentration of 20 grams per liter, and sodium sulfate concentration of 10 grams per liter, with the pH adjusted to 4.00. Plating was conducted at a temperature of 120° F. to obtain a coating thickness of 15.0 microinches. Current density in this test was 40 amperes per square foot with pulses 0.15 seconds long and a time interval between pulses of 1.0 seconds (current pulses would thus be 6 amper-seconds per square foot). The total number of pulses were sufficient to obtain the stated plating thickness.

The next two columns in the Table state the magnetic hysteresis properties of the film deposited in the respective test. The column headed "HC" is the coercivity stated in oersteds. The column headed "BY" is the retentivity in gauss. The first entries in the Table are blank in the hysteresis properties indicating that the film was essentially non-magnetic or for some other reason data could not be obtained. These results which are ignored in the analysis may be due to a discrepancy in the plating process or in the measuring apparatus, or may be the result of an improperly prepared substrate. When the plating parameters are near the process limits, the films may be non-magnetic because the combination of parameters is outside operable ranges. This could be true, for example, in tests at 140° F.

The magnetic properties of coercivity and retentivity set forth in Table 1 are estimated to be within less than 20% of the correct absolute values. These data were obtained by comparison with internally maintained standards and are self-consistent within about 5% in mid range, which is the approximate reading sensitivity of the instrumentation employed for these tests. Somewhat better accuracy may be present in the higher ranges of the stated values.

The final three columns in the Table are an analysis of the hysteresis loop photographed in each test. The several photographs were individually analyzed by the same person on a semi-quantitative basis to determine rectangularity. The first of these three columns headed "A" simply represents whether the hysteresis loop was generally acceptable or not. The numeral 1 indicates a loop susceptible to analysis. The numeral 2 either represents no hysteresis loop at all or a loop so badly skewed as to be unusable for analysis. The second column headed "P" simply represents the usability of the photographs taken. Any correctible discrepancies have been resolved and columns A and P need not be considered in analysis of the data.

The final column in the Table, headed "L", contains three digits for every meaningful test. The initial tests in Table 1 may have less than three digits and can be ignored. The three digits in Column L represent a semi-quantitative subjective analysis of the loop. The first digit indicates the general condition of the loop. The second digit indicates verticality of the side of the loop, that is, the angle of the side relative to the axis at $H_c$. The third digit in Column L represents the radius $R_2$ of the knee of the hysteresis loop. It was found that almost invariably the radius of curvature $R_1$ of the ankle is comparable to or smaller than the radius of curvature of the knee. Although the ankle was observed in the tests for evidence of anomalies, it was not specifically rated.

The first digit in column L representing the general condition of the hysteresis loop may have any of four numerical values. A numeral 1 in the first column indicates a generally normal hysteresis loop indicative of normal conditions in the plated film. The numeral 2 indicates a generally normal loop except that the knee has some anomalous appearance. Ordinarily this is interpreted to mean that the plating does not have uniform magnetic properties in the portion being tested. Generally speaking such an anomaly in the knee represents an unacceptable hysteresis loop. The numeral 3 indicates what is known as a double loop, which appears to have two knees. This almost invariably represents nonuniformity of magnetic properties throughout the sample being tested and is deemed unacceptable. Either of these anomalies can arise from an improperly prepared substrate or other experimental discrepancy unrelated to the plating parameters. A numeral 4 essentially means no loop at all. Either a numeral 3 or 4 is unacceptable and usually a numeral 2 suggests that the loop is unacceptable.

The second digit in column L indicates the verticality of the side of the loop. A numeral 1 indicates that the side is essentially vertical or makes an angle of 90° with the axis as judged by subjective analysis of the hysteresis loop photographs. The numeral 2 indicates that some slope is noticeable in the side of the loop, that is, the side is more than a very few degrees off vertical. The numeral 3 indicates that there is an appreciable slope to the side which might, for example, be about 15 degrees or more from the vertical. That is, the angle between the side and the horizontal axis would be less than about 75°. A verticality rating of 3 would be unacceptable. A rating of 2 is passable as a recording film but a rating of 1 should be obtained for very high density recording.

The last digit in column L is a rating of the radius of curvature of the knee. The numeral 1 indicates that the knee is essentially a right angle or has a very small radius of curvature in the scale of these photographs. Any hysteresis loop with a knee radius up to about 1/16 inch was given a rating of 1. The numeral 2 represents what was considered a noticeable radius of curvature, that is, something in excess of 1/16 inch. The numeral 3 indicates that the radius of curvature was substantial, that is over about 3/16 inch in the hysteresis loop photographs. Generally speaking a rating of 3 represents an unacceptable hysteresis loop for these purposes. A rating of 2 is passable for magnetic recording but a rating of 1 is important for very high density data recording.

In summary for recording at bit densities of 5000 bits per inch or more the loop analysis should be all 1's. The retentivity and coercivity can be selected from Table 1 to any desired value to fit a given recording and reading system. Thus, for example, if one wishes a retentivity of 5,200 gauss, one can find plating conditions from Table 1 suitable for coercivities from 90 to 630 oersteds, all with excellent rectangularity of the hysteresis loop.

Figure 3:
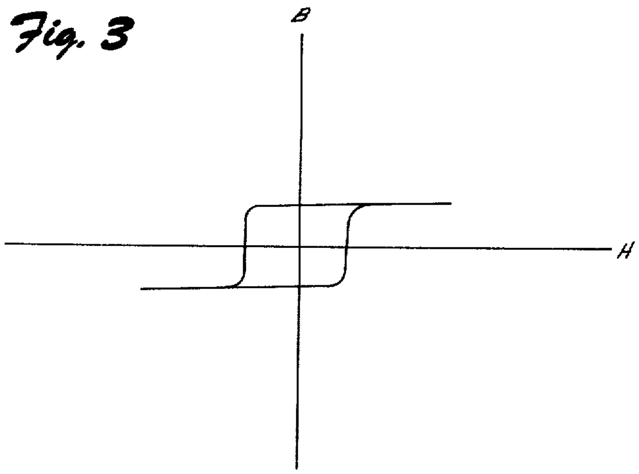
FIG. 3 illustrates a typical hysteresis loop of a magnetic recording medium deposited according to principles of this invention.

FIG. 3 is a full scale tracing of a typical hysteresis loop photograph for a magnetic coating deposited according to principles of this invention. This loop has a high degree of rectangularity and would be given a rating of 111 in the analysis set forth in Table 1. The retentivity of this sample is about 4800 gauss and the coercivity is about 510 oersted. This sample was deposited from a bath having a cobaltous ion concentration of 7.5 grams per liter, a nickelous ion concentration of 40 grams per liter, a nickel to cobalt ratio of 5.33, a sodium phosphite concentration of 7.5 grams per liter, a sodium formate concentration of 20 grams per liter, a boric acid concentration of 20 grams per liter, and a sodium sulfate concentration of 10 grams per liter, and with the pH adjusted to 4.25. Plating was conducted at 80° F. to produce a coating 7.5 microinches thick. Current density was 50 amperes per square foot with pulses 0.10 seconds long and a time interval of 5.0 seconds between pulses.

Although many examples of plating process in accordance with principles of this invention have been set forth in detail herein, many modifications and variations will be apparent to one skilled in the art. It is therefore to be understood that within the scope of the appended claims the invention may be practiced otherwise than as specifically described.

APPENDIX

TABLE 1

| TKNS | ELECTROLYTE | | | CURRENT | | | | HYSTER. PROP. | | LOOP ANALYSIS | | |
|---|---|---|---|---|---|---|---|---|---|---|---|---|
| | CO | ADD. | PH | T | CD | P | PD | HC | BY | A | P | L |
| 15.0 | 10.0 | 15.0 | 4.00 | 120 | 40 | .15 | 1.0 | | | 1 | 1 | 123 |
| 7.5 | 5.0 | 10.0 | 4.20 | 120 | 30 | | | | | 2 | 1 | 1 |
| 7.5 | 5.0 | 5.0 | 4.25 | 80 | 10 | .40 | 2.5 | | | 2 | 1 | 2 |
| 7.5 | 5.0 | 7.5 | 4.20 | 100 | 30 | .40 | 5.0 | | | 2 | 1 | 2 |
| 7.5 | 5.0 | 7.5 | 4.20 | 120 | 10 | | | | | 2 | 1 | 2 |
| 7.5 | 7.5 | 7.5 | 4.25 | 90 | 20 | .10 | 2.5 | | | 2 | 1 | 2 |
| 7.5 | 7.5 | 7.5 | 4.25 | 120 | 10 | .10 | 2.5 | | | 2 | 1 | 2 |
| 7.5 | 7.5 | 7.5 | 4.25 | 120 | 30 | .10 | 2.5 | | | 2 | 1 | 2 |
| 7.5 | 7.5 | 7.5 | 4.25 | 120 | 30 | .10 | 5.0 | | | 2 | 1 | 2 |
| 7.5 | 10.0 | 5.0 | 4.25 | 80 | 10 | .10 | 5.0 | | | 2 | 1 | 2 |
| 7.5 | 10.0 | 5.0 | 4.25 | 120 | 10 | .10 | 1.0 | | | 2 | 1 | 2 |
| 7.5 | 10.0 | 5.0 | 4.25 | 120 | 10 | .10 | 5.0 | | | 2 | 1 | 2 |
| 7.5 | 10.0 | 5.0 | 4.25 | 120 | 30 | .10 | 5.0 | | | 2 | 1 | 2 |
| 7.5 | 10.0 | 7.5 | 4.15 | 120 | 10 | .40 | 5.0 | | | 2 | 1 | 2 |
| 7.5 | 10.0 | 10.0 | 4.15 | 120 | 10 | | | | | 2 | 1 | 2 |
| 15.0 | 10.0 | 15.0 | 4.10 | 120 | 30 | .02 | 1.0 | | | 2 | 1 | 2 |
| 7.5 | 10.0 | 5.0 | 4.00 | 80 | 10 | .20 | 2.5 | | | 2 | 1 | 213 |
| 7.5 | 10.0 | 10.0 | 4.10 | 90 | 30 | .04 | 1.0 | | | 2 | 1 | 213 |
| 7.5 | 7.5 | 10.0 | 4.10 | 140 | 30 | .10 | 1.0 | | | 2 | 1 | 233 |
| 7.5 | 7.5 | 10.0 | 4.10 | 140 | 30 | .20 | 1.0 | | | 2 | 1 | 233 |
| 7.5 | 7.5 | 10.0 | 4.10 | 140 | 30 | .40 | 10.0 | | | 2 | 1 | 233 |
| 7.5 | 7.5 | 10.0 | 4.10 | 140 | 50 | .10 | 5.0 | | | 2 | 1 | 233 |
| 7.5 | 10.0 | 10.0 | 4.10 | 140 | 10 | | | | | 2 | 1 | 233 |
| 7.5 | 10.0 | 10.0 | 4.10 | 140 | 10 | .02 | 1.0 | | | 2 | 1 | 233 |
| 7.5 | 10.0 | 10.0 | 4.10 | 140 | 10 | .04 | 1.0 | | | 2 | 1 | 233 |
| 7.5 | 10.0 | 10.0 | 4.10 | 140 | 10 | .15 | 1.0 | | | 2 | 1 | 233 |
| 7.5 | 10.0 | 10.0 | 4.10 | 140 | 30 | .04 | 1.0 | | | 2 | 1 | 233 |
| 7.5 | 10.0 | 10.0 | 4.10 | 140 | 30 | .08 | 1.0 | | | 2 | 1 | 233 |
| 7.5 | 10.0 | 10.0 | 4.10 | 140 | 50 | .06 | 1.0 | | | 2 | 1 | 233 |
| 7.5 | 5.0 | 5.0 | 4.25 | 80 | 10 | .10 | 1.0 | | | 2 | 1 | 3 |
| 7.5 | 5.0 | 5.0 | 4.25 | 80 | 10 | .10 | 5.0 | | | 2 | 1 | 3 |
| 7.5 | 5.0 | 7.5 | 4.20 | 120 | 30 | .40 | 5.0 | | | 2 | 1 | 3 |
| 7.5 | 5.0 | 10.0 | 4.20 | 140 | 50 | .10 | 1.0 | | | 2 | 1 | 3 |
| 7.5 | 7.5 | 7.5 | 4.00 | 80 | 10 | .20 | 5.0 | | | 2 | 1 | 3 |
| 7.5 | 7.5 | 7.5 | 4.25 | 80 | 10 | .20 | 2.5 | | | 2 | 1 | 3 |
| 7.5 | 7.5 | 7.5 | 4.25 | 90 | 20 | .10 | 1.0 | | | 2 | 1 | 3 |
| 7.5 | 7.5 | 10.0 | 4.10 | 100 | 30 | .10 | 1.0 | | | 2 | 1 | 3 |
| 7.5 | 7.5 | 10.0 | 4.10 | 100 | 30 | .10 | 2.5 | | | 2 | 1 | 3 |
| 7.5 | 10.0 | 5.0 | 4.25 | 80 | 10 | .10 | 1.0 | | | 2 | 1 | 3 |
| 7.5 | 10.0 | 5.0 | 4.25 | 80 | 10 | .10 | 1.0 | | | 2 | 1 | 3 |
| 7.5 | 10.0 | 5.0 | 4.25 | 80 | 10 | .10 | 2.5 | | | 2 | 1 | 3 |
| 7.5 | 10.0 | 5.0 | 4.25 | 80 | 10 | .10 | 5.0 | | | 2 | 1 | 3 |
| 7.5 | 10.0 | 5.0 | 4.25 | 80 | 10 | .20 | 5.0 | | | 2 | 1 | 3 |
| 7.5 | 10.0 | 10.0 | 4.10 | 90 | 10 | .02 | 2.5 | | | 2 | 1 | 3 |
| 7.5 | 10.0 | 10.0 | 4.10 | 90 | 30 | .04 | 2.5 | | | 2 | 1 | 3 |
| 7.5 | 10.0 | 10.0 | 3.90 | 100 | 30 | .08 | 1.0 | | | 2 | 1 | 321 |
| 7.5 | 10.0 | 10.0 | 3.90 | 100 | 30 | .04 | 1.0 | | | 2 | 1 | 323 |
| 7.5 | 5.0 | 5.0 | 4.25 | 100 | 10 | .10 | 5.0 | | | 2 | 1 | 4 |
| 7.5 | 5.0 | 7.5 | 4.20 | 120 | 10 | .10 | 1.0 | | | 2 | 1 | 4 |
| 7.5 | 5.0 | 7.5 | 4.20 | 120 | 10 | .40 | 5.0 | | | 2 | 1 | 4 |
| 7.5 | 7.5 | 7.5 | 4.00 | 120 | 10 | .10 | 1.0 | | | 2 | 1 | 4 |
| 7.5 | 10.0 | 10.0 | 3.50 | 140 | 10 | | | | | 2 | 1 | 4 |
| 7.5 | 10.0 | 10.0 | 3.50 | 140 | 10 | .02 | 1.0 | | | 2 | 1 | 4 |
| 7.5 | 10.0 | 10.0 | 3.50 | 140 | 10 | .04 | 1.0 | | | 2 | 1 | 4 |
| 7.5 | 10.0 | 10.0 | 3.50 | 140 | 10 | .08 | 1.0 | | | 2 | 1 | 4 |
| 7.5 | 10.0 | 10.0 | 3.50 | 140 | 10 | .20 | 1.0 | | | 2 | 1 | 4 |
| 7.5 | 10.0 | 10.0 | 3.70 | 140 | 10 | .02 | 1.0 | | | 2 | 1 | 4 |
| 7.5 | 10.0 | 10.0 | 3.70 | 140 | 10 | .02 | 2.5 | | | 2 | 1 | 4 |
| 7.5 | 10.0 | 10.0 | 3.70 | 140 | 10 | .08 | 1.0 | | | 2 | 1 | 4 |
| 7.5 | 10.0 | 10.0 | 3.90 | 140 | 10 | | | | | 2 | 1 | 4 |
| 7.5 | 10.0 | 10.0 | 3.90 | 140 | 10 | .02 | 1.0 | | | 2 | 1 | 4 |
| 7.5 | 10.0 | 10.0 | 4.10 | 100 | 10 | .15 | 1.0 | | | 2 | 1 | 4 |
| 7.5 | 10.0 | 10.0 | 3.70 | 140 | 10 | .15 | 1.0 | 100 | 700 | 1 | 1 | 111 |
| 7.5 | 10.0 | 10.0 | 3.70 | 140 | 10 | | | 100 | 700 | 1 | 1 | 122 |
| 7.5 | 7.5 | 7.5 | 4.25 | 100 | 10 | .20 | 2.5 | 710 | 0400 | 1 | 1 | 133 |
| 7.5 | 10.0 | 10.0 | 3.70 | 120 | 10 | .02 | 5.0 | 90 | 1000 | 1 | 1 | 111 |
| 7.5 | 10.0 | 10.0 | 3.70 | 120 | 10 | .02 | 25.0 | 100 | 1000 | 1 | 1 | 111 |
| 7.5 | 10.0 | 10.0 | 3.50 | 120 | 10 | .02 | 1.0 | 100 | 1000 | 1 | 1 | 121 |
| 7.5 | 10.0 | 10.0 | 3.90 | 140 | 10 | .04 | 1.0 | 100 | 1100 | 1 | 1 | 123 |
| 5.5 | 7.5 | 7.5 | 4.00 | 80 | 20 | .10 | 2.5 | 90 | 1200 | 1 | 1 | 111 |
| 7.5 | 10.0 | 10.0 | 3.50 | 120 | 10 | .04 | 1.0 | 100 | 1200 | 1 | 1 | 111 |
| 7.5 | 7.5 | 7.5 | 4.00 | 80 | 20 | .10 | 1.0 | 110 | 1200 | 1 | 1 | 111 |
| 7.5 | 5.0 | 10.0 | 4.20 | 140 | 30 | .10 | 1.0 | 110 | 1300 | 1 | 1 | 123 |
| 7.5 | 7.5 | 7.5 | 4.25 | 90 | 10 | .10 | 5.0 | 200 | 1400 | 1 | 1 | 133 |
| 7.5 | 10.0 | 10.0 | 4.10 | 90 | 10 | .02 | 5.0 | 210 | 1500 | 1 | 1 | 123 |
| 7.5 | 10.0 | 10.0 | 4.10 | 140 | 10 | .08 | 1.0 | 315 | 1600 | 1 | 1 | 233 |
| 7.5 | 10.0 | 10.0 | 3.70 | 120 | 10 | .20 | 1.0 | 100 | 1700 | 1 | 1 | 113 |
| 7.5 | 5.0 | 10.0 | 4.20 | 140 | 30 | .40 | 5.0 | 200 | 1700 | 1 | 1 | 123 |
| 7.5 | 7.5 | 7.5 | 4.00 | 80 | 20 | .20 | 2.5 | 100 | 1800 | 1 | 1 | 111 |
| 7.5 | 7.5 | 7.5 | 4.00 | 80 | 20 | .40 | 2.5 | 100 | 1800 | 1 | 1 | 111 |

APPENDIX-continued

TABLE 1

| TKNS | ELECTROLYTE | | | CURRENT | | | | HYSTER. PROP. | | LOOP ANALYSIS | | |
|---|---|---|---|---|---|---|---|---|---|---|---|---|
| | CO | ADD. | PH | T | CD | P | PD | HC | BY | A | P | L |
| 7.5 | 7.5 | 7.5 | 4.00 | 80 | 20 | .10 | 5.0 | 110 | 1800 | 1 | 1 | 111 |
| 7.5 | 7.5 | 7.5 | 4.00 | 80 | 10 | .10 | 05.0 | 170 | 1800 | 1 | 1 | 113 |
| 7.5 | 7.5 | 7.5 | 4.25 | 120 | 10 | .10 | 5.0 | 210 | 1800 | 1 | 1 | 133 |
| 7.5 | 7.5 | 7.5 | 4.25 | 100 | 10 | .10 | 5.0 | 390 | 1800 | 1 | 1 | 133 |
| 7.5 | 7.5 | 7.5 | 4.00 | 80 | 10 | .10 | 2.5 | 160 | 2000 | 1 | 1 | 122 |
| 7.5 | 7.5 | 7.5 | 4.25 | 120 | 10 | .20 | 5.0 | 340 | 2000 | 1 | 1 | 133 |
| 7.5 | 7.5 | 7.5 | 4.25 | 120 | 20 | .10 | 5.0 | 410 | 2100 | 1 | 1 | 133 |
| 7.5 | 7.5 | 7.5 | 4.00 | 120 | 10 | .40 | 2.5 | 90 | 2200 | 1 | 1 | 111 |
| 7.5 | 10.0 | 10.0 | 3.70 | 120 | 10 | .04 | 25.0 | 100 | 2200 | 1 | 1 | 111 |
| 7.5 | 10.0 | 10.0 | 3.90 | 140 | 10 | .08 | 1.0 | 100 | 2200 | 1 | 1 | 111 |
| 7.5 | 10.0 | 10.0 | 3.90 | 140 | 10 | .15 | 1.0 | 110 | 2200 | 1 | 1 | 111 |
| 7.5 | 10.0 | 10.0 | 4.10 | 120 | 10 | .04 | 1.0 | 430 | 2200 | 1 | 1 | 233 |
| 7.5 | 10.0 | 10.0 | 4.10 | 120 | 10 | .08 | 1.0 | 440 | 2200 | 1 | 1 | 233 |
| 7.5 | 10.0 | 10.0 | 3.70 | 120 | 10 | .04 | 5.0 | 90 | 2300 | 1 | 1 | 111 |
| 7.5 | 7.5 | 7.5 | 4.00 | 80 | 10 | .40 | 5.0 | 100 | 2300 | 1 | 1 | 111 |
| 7.5 | 7.5 | 7.5 | 4.00 | 80 | 20 | .20 | 1.0 | 100 | 2300 | 1 | 1 | 111 |
| 7.5 | 10.0 | 10.0 | 4.10 | 120 | 10 | .02 | 1.0 | 110 | 2300 | 1 | 1 | 111 |
| 7.5 | 10.0 | 10.0 | 4.10 | 120 | 10 | | | 380 | 2300 | 1 | 1 | 133 |
| 7.5 | 10.0 | 10.0 | 3.90 | 140 | 30 | .15 | 5.0 | 410 | 2300 | 1 | 1 | 133 |
| 7.5 | 10.0 | 10.0 | 4.10 | 120 | 30 | .04 | 5.0 | 480 | 2300 | 1 | 1 | 133 |
| 7.5 | 5.0 | 5.0 | 4.25 | 120 | 10 | .10 | 1.0 | 180 | 2400 | 1 | 1 | 133 |
| 7.5 | 10.0 | 10.0 | 3.50 | 100 | 10 | .02 | 1.0 | 90 | 2500 | 1 | 1 | 111 |
| 7.5 | 7.5 | 7.5 | 4.00 | 80 | 20 | .20 | 5.0 | 100 | 2500 | 1 | 1 | 111 |
| 7.5 | 7.5 | 7.5 | 4.00 | 80 | 70 | .10 | 5.0 | 410 | 2500 | 1 | 1 | 111 |
| 7.5 | 7.5 | 10.0 | 4.10 | 120 | 10 | .10 | 1.0 | 150 | 2500 | 1 | 1 | 122 |
| 7.5 | 10.0 | 7.5 | 4.15 | 120 | 10 | .10 | 1.0 | 140 | 2500 | 1 | 1 | 123 |
| 7.5 | 10.0 | 10.0 | 3.90 | 140 | 30 | .15 | 10.0 | 260 | 2500 | 1 | 1 | 132 |
| 7.5 | 10.0 | 10.0 | 3.90 | 140 | 50 | .08 | 5.0 | 410 | 2500 | 1 | 1 | 133 |
| 7.5 | 10.0 | 10.0 | 3.70 | 120 | 10 | .04 | 5.0 | 90 | 2600 | 1 | 1 | 111 |
| 7.5 | 7.5 | 7.5 | 4.25 | 90 | 20 | .10 | 5.0 | 300 | 2600 | 1 | 1 | 113 |
| 7.5 | 10.0 | 5.0 | 4.25 | 100 | 10 | .10 | 5.0 | 300 | 2600 | 1 | 1 | 133 |
| 7.5 | 10.0 | 10.0 | 4.10 | 140 | 50 | .23 | 1.0 | 410 | 2600 | 1 | 1 | 233 |
| 7.5 | 10.0 | 10.0 | 4.10 | 140 | 70 | .08 | 1.0 | 450 | 2600 | 1 | 1 | 233 |
| 7.5 | 10.0 | 10.0 | 3.50 | 140 | 30 | .04 | 1.0 | 90 | 2700 | 1 | 1 | 111 |
| 7.5 | 10.0 | 10.0 | 3.70 | 120 | 10 | .02 | 1.0 | 90 | 2700 | 1 | 1 | 111 |
| 7.5 | 7.5 | 7.5 | 4.00 | 80 | 10 | .40 | 5.0 | 100 | 2700 | 1 | 1 | 111 |
| 7.5 | 7.5 | 7.5 | 4.00 | 80 | 20 | .40 | 5.0 | 110 | 2700 | 1 | 1 | 111 |
| 7.5 | 7.5 | 7.5 | 4.25 | 120 | 20 | .10 | 1.0 | 410 | 2700 | 1 | 1 | 133 |
| 7.5 | 7.5 | 10.0 | 4.10 | 120 | 10 | .40 | 5.0 | 410 | 2700 | 1 | 1 | 133 |
| 7.5 | 10.0 | 10.0 | 4.10 | 140 | 30 | | | 410 | 2700 | 1 | 1 | 133 |
| 7.5 | 7.5 | 7.5 | 4.25 | 120 | 20 | .10 | 2.5 | 420 | 2700 | 1 | 1 | 133 |
| 7.5 | 7.5 | 7.5 | 4.25 | 120 | 10 | .20 | 2.5 | 440 | 2700 | 1 | 1 | 133 |
| 7.5 | 7.5 | 7.5 | 4.25 | 80 | 10 | .40 | 5.0 | 450 | 2700 | 1 | 1 | 133 |
| 7.5 | 7.5 | 10.0 | 4.10 | 140 | 50 | .40 | 10.0 | 450 | 2700 | 1 | 1 | 133 |
| 7.5 | 10.0 | 10.0 | 4.10 | 100 | 10 | .08 | 10.0 | 490 | 2700 | 1 | 1 | 133 |
| 7.5 | 7.5 | 10.0 | 4.10 | 140 | 50 | .10 | 1.0 | 530 | 2700 | 1 | 1 | 133 |
| 7.5 | 10.0 | 10.0 | 4.10 | 140 | 30 | .15 | 1.0 | 410 | 2700 | 1 | 1 | 233 |
| 7.5 | 10.0 | 10.0 | 3.90 | 120 | 10 | .02 | 1.0 | 100 | 2800 | 1 | 1 | 111 |
| 7.5 | 5.0 | 5.0 | 4.25 | 120 | 30 | .10 | 5.0 | 190 | 2800 | 1 | 1 | 112 |
| 7.5 | 5.0 | 10.0 | 4.20 | 120 | 30 | .10 | 1.0 | 120 | 2800 | 1 | 1 | 113 |
| 7.5 | 5.0 | 5.0 | 4.25 | 100 | 10 | .40 | 5.0 | 300 | 2800 | 1 | 1 | 122 |
| 7.5 | 10.0 | 10.0 | 3.90 | 140 | 30 | .08 | 1.0 | 490 | 2800 | 1 | 1 | 123 |
| 7.5 | 7.5 | 10.0 | 4.10 | 140 | 30 | | | 450 | 2800 | 1 | 1 | 133 |
| 7.5 | 7.5 | 7.5 | 4.25 | 120 | 20 | .20 | 2.5 | 600 | 2800 | 1 | 1 | 133 |
| 7.5 | 10.0 | 10.0 | 3.50 | 120 | 10 | | | 90 | 2900 | 1 | 1 | 111 |
| 7.5 | 5.0 | 10.0 | 4.20 | 100 | 10 | .10 | 1.0 | 100 | 2900 | 1 | 1 | 113 |
| 7.5 | 7.5 | 7.5 | 4.00 | 140 | 30 | .40 | 5.0 | 230 | 2900 | 1 | 1 | 132 |
| 7.5 | 7.5 | 10.0 | 4.10 | 120 | 10 | | | 340 | 2900 | 1 | 1 | 133 |
| 7.5 | 10.0 | 5.0 | 4.25 | 120 | 10 | .40 | 5.0 | 540 | 2900 | 1 | 1 | 133 |
| 7.5 | 10.0 | 10.0 | 3.50 | 120 | 10 | .08 | 1.0 | 90 | 3000 | 1 | 1 | 111 |
| 7.5 | 10.0 | 10.0 | 3.50 | 120 | 10 | .15 | 1.0 | 90 | 3000 | 1 | 1 | 111 |
| 7.5 | 10.0 | 10.0 | 3.70 | 120 | 10 | .08 | 1.0 | 90 | 3000 | 1 | 1 | 111 |
| 7.5 | 5.0 | 5.0 | 4.25 | 100 | 50 | | | 280 | 3000 | 1 | 1 | 111 |
| 7.5 | 7.5 | 7.5 | 4.00 | 140 | 30 | .10 | 1.0 | 150 | 3000 | 1 | 1 | 122 |
| 7.5 | 7.5 | 7.5 | 4.25 | 100 | 10 | | | 530 | 3000 | 1 | 1 | 122 |
| 7.5 | 7.5 | 7.5 | 4.25 | 90 | 10 | .10 | 2.5 | 150 | 3000 | 1 | 1 | 123 |
| 7.5 | 10.0 | 10.0 | 3.90 | 140 | 30 | .15 | 2.5 | 490 | 3000 | 1 | 1 | 123 |
| 7.5 | 10.0 | 10.0 | 3.90 | 140 | 50 | .08 | 2.5 | 470 | 3000 | 1 | 1 | 133 |
| 7.5 | 10.0 | 10.0 | 3.90 | 140 | 30 | .15 | 1.0 | 490 | 3000 | 1 | 1 | 133 |
| 7.5 | 7.5 | 7.5 | 4.25 | 100 | 20 | .10 | 5.0 | 650 | 3000 | 1 | 1 | 133 |
| 7.5 | 10.0 | 10.0 | 4.10 | 140 | 50 | .12 | 1.0 | 470 | 3000 | 1 | 1 | 233 |
| 7.5 | 10.0 | 10.0 | 4.10 | 100 | 10 | .02 | 5.0 | 120 | 3100 | 1 | 1 | 112 |
| 7.5 | 10.0 | 10.0 | 3.90 | 140 | 50 | .08 | 1.0 | 530 | 3100 | 1 | 1 | 133 |
| 7.5 | 10.0 | 10.0 | 4.10 | 100 | 30 | .08 | 5.0 | 560 | 3100 | 1 | 1 | 133 |
| 7.5 | 10.0 | 10.0 | 4.10 | 120 | 30 | .04 | 2.5 | 570 | 3100 | 1 | 1 | 133 |
| 7.5 | 7.5 | 7.5 | 4.25 | 100 | 10 | .10 | 2.5 | 580 | 3100 | 1 | 1 | 133 |
| 7.5 | 7.5 | 7.5 | 4.00 | 80 | 50 | .20 | 2.5 | 450 | 3200 | 1 | 1 | 111 |
| 7.5 | 7.5 | 7.5 | 4.00 | 80 | 50 | .20 | 1.0 | 500 | 3200 | 1 | 1 | 111 |
| 7.5 | 10.0 | 10.0 | 4.15 | 120 | 10 | .10 | 1.0 | 110 | 3200 | 1 | 1 | 113 |
| 7.5 | 7.5 | 7.5 | 4.00 | 80 | 50 | .10 | 1.0 | 380 | 3200 | 1 | 1 | 121 |
| 7.5 | 7.5 | 7.5 | 4.25 | 80 | 10 | .40 | 5.0 | 530 | 3200 | 1 | 1 | 133 |
| 7.5 | 10.0 | 10.0 | 4.10 | 100 | 10 | .15 | 10.0 | 590 | 3200 | 1 | 1 | 133 |
| 7.5 | 10.0 | 10.0 | 3.90 | 140 | 50 | .11 | 5.0 | 620 | 3200 | 1 | 1 | 133 |
| 7.5 | 10.0 | 5.0 | 4.25 | 100 | 30 | .50 | 5.0 | 680 | 3200 | 1 | 1 | 133 |
| 7.5 | 7.5 | 7.5 | 4.00 | 80 | 20 | .40 | 1.0 | 140 | 3300 | 1 | 1 | 111 |
| 7.5 | 7.5 | 7.5 | 4.00 | 80 | 50 | .40 | 5.0 | 460 | 3300 | 1 | 1 | 111 |

APPENDIX-continued

TABLE I

| TKNS | ELECTROLYTE | | | CURRENT | | | | HYSTER. PROP. | | LOOP ANALYSIS | | |
|---|---|---|---|---|---|---|---|---|---|---|---|---|
| | CO | ADD. | PH | T | CD | P | PD | HC | BY | A | P | L |
| 7.5 | 5.0 | 5.0 | 4.25 | 120 | 10 | .40 | 5.0 | 290 | 3300 | 1 | 1 | 122 |
| 7.5 | 5.0 | 5.0 | 4.25 | 100 | 10 | .10 | 1.0 | 150 | 3300 | 1 | 1 | 133 |
| 7.5 | 7.5 | 7.5 | 4.25 | 90 | 10 | .20 | 2.5 | 460 | 3300 | 1 | 1 | 133 |
| 7.5 | 10.0 | 10.0 | 4.10 | 90 | 30 | .04 | 5.0 | 600 | 3300 | 1 | 1 | 133 |
| 7.5 | 7.5 | 7.5 | 4.25 | 120 | 70 | .10 | 5.0 | 650 | 3300 | 1 | 1 | 133 |
| 7.5 | 10.0 | 10.0 | 3.70 | 120 | 10 | .04 | 2.5 | 90 | 3400 | 1 | 1 | 111 |
| 7.5 | 7.5 | 7.5 | 4.00 | 80 | 50 | .10 | 2.5 | 160 | 3400 | 1 | 1 | 111 |
| 7.5 | 7.5 | 7.5 | 4.00 | 80 | 50 | .40 | 2.5 | 460 | 3400 | 1 | 1 | 111 |
| 7.5 | 5.0 | 7.5 | 4.20 | 140 | 30 | .10 | 1.0 | 170 | 3400 | 1 | 1 | 123 |
| 7.5 | 7.5 | 10.0 | 4.10 | 140 | 70 | .10 | 1.0 | 560 | 3400 | 1 | 1 | 133 |
| 7.5 | 7.5 | 7.5 | 4.25 | 120 | 50 | .10 | 5.0 | 680 | 3400 | 1 | 1 | 133 |
| 7.5 | 10.0 | 5.0 | 4.25 | 100 | 30 | .10 | 15.0 | 680 | 3400 | 1 | 1 | 133 |
| 7.5 | 10.0 | 10.0 | 3.50 | 140 | 30 | .08 | 1.0 | 90 | 3500 | 1 | 1 | 111 |
| 7.5 | 7.5 | 7.5 | 4.00 | 80 | 70 | .30 | 2.5 | 440 | 3500 | 1 | 1 | 111 |
| 7.5 | 7.5 | 7.5 | 4.25 | 90 | 10 | .20 | 5.0 | 150 | 3500 | 1 | 1 | 113 |
| 7.5 | 10.0 | 10.0 | 3.90 | 140 | 30 | .16 | 1.0 | 500 | 3500 | 1 | 1 | 123 |
| 7.5 | 10.0 | 10.0 | 3.90 | 140 | 50 | .15 | 10.0 | 530 | 3500 | 1 | 1 | 133 |
| 7.5 | 7.5 | 7.5 | 4.25 | 120 | 30 | .20 | 5.0 | 570 | 3500 | 1 | 1 | 133 |
| 7.5 | 10.0 | 10.0 | 4.10 | 100 | 10 | .08 | 5.0 | 600 | 3500 | 1 | 1 | 133 |
| 7.5 | 7.5 | 7.5 | 4.00 | 120 | 10 | | | 80 | 3600 | 1 | 1 | 111 |
| 7.5 | 7.5 | 7.5 | 4.00 | 80 | 50 | .40 | 1.0 | 410 | 3600 | 1 | 1 | 111 |
| 7.5 | 7.5 | 7.5 | 4.00 | 80 | 50 | .20 | 5.0 | 460 | 3600 | 1 | 1 | 111 |
| 7.5 | 5.0 | 7.5 | 4.20 | 140 | 30 | .40 | 5.0 | 180 | 3600 | 1 | 1 | 113 |
| 7.5 | 5.0 | 5.0 | 4.25 | 120 | 30 | .10 | 5.0 | 490 | 3600 | 1 | 1 | 123 |
| 7.5 | 7.5 | 7.5 | 4.25 | 120 | 10 | .20 | 1.0 | 500 | 3600 | 1 | 1 | 123 |
| 15.0 | 10.0 | 15.0 | 4.00 | 120 | 30 | .08 | 1.0 | 300 | 3600 | 1 | 1 | 132 |
| 7.5 | 7.5 | 7.5 | 4.25 | 120 | 10 | .40 | 2.5 | 490 | 3600 | 1 | 1 | 133 |
| 7.5 | 10.0 | 10.0 | 4.10 | 100 | 30 | .04 | 5.0 | 700 | 3600 | 1 | 1 | 133 |
| 7.5 | 7.5 | 7.5 | 4.25 | 100 | 10 | .20 | 5.0 | 710 | 3600 | 1 | 1 | 133 |
| 7.5 | 10.0 | 10.0 | 3.50 | 100 | 10 | .04 | 1.0 | 90 | 3700 | 1 | 1 | 111 |
| 7.5 | 10.0 | 10.0 | 3.90 | 120 | 10 | | | 180 | 3700 | 1 | 1 | 111 |
| 7.5 | 5.0 | 10.0 | 4.20 | 100 | 10 | .40 | 5.0 | 190 | 3700 | 1 | 1 | 112 |
| 7.5 | 10.0 | 10.0 | 4.15 | 120 | 10 | .40 | 1.0 | 130 | 3700 | 1 | 1 | 113 |
| 7.5 | 10.0 | 10.0 | 4.10 | 120 | 30 | .08 | 1.0 | 470 | 3700 | 1 | 1 | 122 |
| 7.5 | 7.5 | 7.5 | 4.25 | 120 | 20 | .20 | 5.0 | 470 | 3700 | 1 | 1 | 133 |
| 7.5 | 10.0 | 10.0 | 4.10 | 140 | 50 | | | 490 | 3700 | 1 | 1 | 133 |
| 7.5 | 7.5 | 10.0 | 4.10 | 140 | 70 | .40 | 10.0 | 550 | 3700 | 1 | 1 | 133 |
| 7.5 | 10.0 | 10.0 | 3.70 | 120 | 10 | .08 | 5.0 | 90 | 3800 | 1 | 1 | 111 |
| 7.5 | 10.0 | 10.0 | 3.50 | 100 | 50 | .15 | 1.0 | 150 | 3800 | 1 | 1 | 111 |
| 7.5 | 7.5 | 7.5 | 4.00 | 80 | 70 | .30 | 5.0 | 450 | 3800 | 1 | 1 | 111 |
| 7.5 | 5.0 | 7.5 | 4.20 | 120 | 30 | .10 | 1.0 | 150 | 3800 | 1 | 1 | 113 |
| 7.5 | 10.0 | 10.0 | 4.10 | 100 | 30 | .15 | 2.5 | 530 | 3800 | 1 | 1 | 122 |
| 7.5 | 10.0 | 10.0 | 3.90 | 140 | 50 | .06 | 1.0 | 550 | 3800 | 1 | 1 | 123 |
| 7.5 | 10.0 | 10.0 | 3.90 | 140 | 50 | .11 | 2.5 | 550 | 3800 | 1 | 1 | 123 |
| 7.5 | 10.0 | 10.0 | 4.10 | 100 | 30 | .15 | 5.0 | 530 | 3800 | 1 | 1 | 132 |
| 7.5 | 10.0 | 10.0 | 3.70 | 140 | 30 | | | 230 | 3800 | 1 | 1 | 133 |
| 7.5 | 10.0 | 10.0 | 4.10 | 100 | 10 | .08 | 1.0 | 500 | 3800 | 1 | 1 | 133 |
| 7.5 | 10.0 | 10.0 | 3.90 | 140 | 50 | .15 | 5.0 | 530 | 3800 | 1 | 1 | 133 |
| 7.5 | 10.0 | 10.0 | 4.10 | 120 | 30 | .04 | 1.0 | 580 | 3800 | 1 | 1 | 133 |
| 7.5 | 10.0 | 10.0 | 4.10 | 100 | 10 | .15 | 2.5 | 600 | 3800 | 1 | 1 | 133 |
| 7.5 | 10.0 | 10.0 | 4.10 | 100 | 10 | .15 | 5.0 | 600 | 3800 | 1 | 1 | 133 |
| 7.5 | 7.5 | 7.5 | 4.25 | 120 | 30 | .20 | 2.5 | 630 | 3800 | 1 | 1 | 133 |
| 7.5 | 7.5 | 7.5 | 4.25 | 120 | 50 | .10 | 2.5 | 730 | 3800 | 1 | 1 | 133 |
| 7.5 | 10.0 | 10.0 | 3.70 | 120 | 10 | | | 80 | 3900 | 1 | 1 | 111 |
| 7.5 | 10.0 | 10.0 | 3.70 | 120 | 10 | .08 | 1.0 | 90 | 3900 | 1 | 1 | 111 |
| 7.5 | 10.0 | 10.0 | 3.70 | 100 | 10 | .02 | 1.0 | 110 | 3900 | 1 | 1 | 111 |
| 7.5 | 5.0 | 7.5 | 4.20 | 100 | 30 | .80 | 5.0 | 113 | 3900 | 1 | 1 | 111 |
| 7.5 | 10.0 | 10.0 | 3.90 | 140 | 30 | .04 | 1.0 | 150 | 3900 | 1 | 1 | 111 |
| 7.5 | 7.5 | 7.5 | 4.00 | 80 | 70 | .30 | 1.0 | 440 | 3900 | 1 | 1 | 111 |
| 7.5 | 7.5 | 7.5 | 4.00 | 80 | 10 | .10 | 1.0 | 100 | 3900 | 1 | 1 | 113 |
| 7.5 | 10.0 | 10.0 | 4.10 | 90 | 10 | .08 | 5.0 | 510 | 3900 | 1 | 1 | 123 |
| 7.5 | 10.0 | 10.0 | 3.90 | 140 | 50 | .15 | 2.5 | 520 | 3900 | 1 | 1 | 123 |
| 7.5 | 10.0 | 10.0 | 4.10 | 100 | 10 | .04 | 1.0 | 370 | 3900 | 1 | 1 | 133 |
| 7.5 | 10.0 | 10.0 | 3.90 | 140 | 70 | .09 | 5.0 | 580 | 3900 | 1 | 1 | 133 |
| 7.5 | 10.0 | 10.0 | 4.10 | 100 | 10 | .08 | 2.5 | 580 | 3900 | 1 | 1 | 133 |
| 7.5 | 10.0 | 5.0 | 4.25 | 100 | 30 | .10 | 5.0 | 710 | 3900 | 1 | 1 | 133 |
| 7.5 | 7.5 | 7.5 | 4.25 | 100 | 20 | .10 | 2.5 | 730 | 3900 | 1 | 1 | 133 |
| 7.5 | 10.0 | 10.0 | 3.50 | 140 | 30 | .15 | 1.0 | 90 | 4000 | 1 | 1 | 111 |
| 7.5 | 10.0 | 10.0 | 3.70 | 140 | 30 | .04 | 1.0 | 100 | 4000 | 1 | 1 | 111 |
| 7.5 | 5.0 | 7.5 | 4.20 | 100 | 10 | .10 | 1.0 | 120 | 4000 | 1 | 1 | 111 |
| 7.5 | 5.0 | 10.0 | 3.90 | 120 | 30 | | | 140 | 4000 | 1 | 1 | 111 |
| 7.5 | 5.0 | 5.0 | 4.25 | 80 | 50 | .10 | 5.0 | 440 | 4000 | 1 | 1 | 111 |
| 7.5 | 3.0 | 7.5 | 4.50 | 120 | 30 | | | 330 | 4000 | 1 | 1 | 112 |
| 7.5 | 5.0 | 10.0 | 4.20 | 140 | 70 | .10 | 1.0 | 170 | 4000 | 1 | 1 | 113 |
| 7.5 | 5.0 | 10.0 | 4.20 | 140 | 30 | | | 240 | 4000 | 1 | 1 | 113 |
| 7.5 | 10.0 | 10.0 | 4.10 | 90 | 10 | .04 | 5.0 | 190 | 4000 | 1 | 1 | 122 |
| 7.5 | 7.5 | 7.5 | 4.00 | 80 | 10 | .20 | 2.5 | 150 | 4000 | 1 | 1 | 123 |
| 7.5 | 10.0 | 10.0 | 4.10 | 120 | 30 | .04 | 1.0 | 530 | 4000 | 1 | 1 | 123 |
| 7.5 | 10.0 | 10.0 | 3.90 | 140 | 50 | .11 | 1.0 | 550 | 4000 | 1 | 1 | 123 |
| 7.5 | 10.0 | 10.0 | 4.10 | 120 | 30 | .08 | 2.5 | 580 | 4000 | 1 | 1 | 123 |
| 7.5 | 7.5 | 7.5 | 4.25 | 90 | 20 | .20 | 5.0 | 610 | 4000 | 1 | 1 | 123 |
| 7.5 | 5.0 | 5.0 | 4.40 | 120 | 30 | .02 | 1.0 | 370 | 4000 | 1 | 1 | 133 |
| 10.0 | 7.5 | 10.0 | 4.10 | 120 | 30 | .10 | 1.0 | 570 | 4000 | 1 | 1 | 133 |
| 7.5 | 10.0 | 10.0 | 3.90 | 140 | 70 | 09 | 10.0 | 580 | 4000 | 1 | 1 | 133 |
| 7.5 | 7.5 | 7.5 | 4.25 | 120 | 50 | .20 | 5.0 | 680 | 4000 | 1 | 1 | 133 |
| 7.5 | 7.5 | 7.5 | 4.25 | 80 | 20 | .20 | 5.0 | 710 | 4000 | 1 | 1 | 133 |

APPENDIX-continued

TABLE I

| TKNS | ELECTROLYTE | | | CURRENT | | | | HYSTER. PROP. | | LOOP ANALYSIS | | |
|---|---|---|---|---|---|---|---|---|---|---|---|---|
| | CO | ADD. | PH | T | CD | P | PD | HC | BY | A | P | L |
| 7.5 | 10.0 | 10.0 | 3.50 | 100 | 10 | .08 | 1.0 | 90 | 4100 | 1 | 1 | 111 |
| 7.5 | 10.0 | 10.0 | 3.70 | 120 | 10 | .08 | 2.5 | 90 | 4100 | 1 | 1 | 111 |
| 7.5 | 10.0 | 10.0 | 3.90 | 120 | 10 | .04 | 1.0 | 90 | 4100 | 1 | 1 | 111 |
| 7.5 | 5.0 | 5.0 | 4.25 | 100 | 30 | .10 | 5.0 | 480 | 4100 | 1 | 1 | 111 |
| 7.5 | 5.0 | 5.0 | 4.25 | 120 | 10 | .40 | 1.0 | 290 | 4100 | 1 | 1 | 122 |
| 7.5 | 7.5 | 7.5 | 4.25 | 80 | 10 | .40 | 2.5 | 500 | 4100 | 1 | 1 | 123 |
| 7.5 | 7.5 | 7.5 | 4.25 | 90 | 10 | .40 | 5.0 | 530 | 4100 | 1 | 1 | 132 |
| 7.5 | 10.0 | 10.0 | 4.10 | 140 | 70 | .15 | 1.0 | 530 | 4100 | 1 | 1 | 133 |
| 7.5 | 10.0 | 10.0 | 4.10 | 100 | 30 | .15 | 10.0 | 580 | 4100 | 1 | 1 | 133 |
| 7.5 | 7.5 | 7.5 | 4.25 | 120 | 30 | .10 | 1.0 | 610 | 4100 | 1 | 1 | 133 |
| 7.5 | 10.0 | 10.0 | 3.50 | 100 | 10 | .15 | 1.0 | 90 | 4200 | 1 | 1 | 111 |
| 7.5 | 5.0 | 7.5 | 4.20 | 100 | 10 | | | 120 | 4200 | 1 | 1 | 111 |
| 7.5 | 5.0 | 7.5 | 4.20 | 100 | 50 | .10 | 1.0 | 290 | 4200 | 1 | 1 | 111 |
| 7.5 | 7.5 | 7.5 | 4.00 | 80 | 50 | | | 410 | 4200 | 1 | 1 | 111 |
| 15.0 | 10.0 | 10.0 | 4.10 | 120 | 50 | .03 | 1.0 | 490 | 4200 | 1 | 1 | 112 |
| 7.5 | 7.5 | 7.5 | 4.25 | 100 | 10 | .10 | 1.0 | 640 | 4200 | 1 | 1 | 122 |
| 7.5 | 10.0 | 5.0 | 4.25 | 120 | 10 | .40 | 1.0 | 470 | 4200 | 1 | 1 | 123 |
| 7.5 | 10.0 | 10.0 | 3.90 | 120 | 30 | .15 | 10.0 | 580 | 4200 | 1 | 1 | 133 |
| 7.5 | 10.0 | 10.0 | 4.10 | 100 | 30 | .04 | 2.5 | 670 | 4200 | 1 | 1 | 133 |
| 7.5 | 7.5 | 10.0 | 4.10 | 120 | 30 | .20 | 5.0 | 740 | 4200 | 1 | 1 | 133 |
| 7.5 | 5.0 | 10.0 | 4.20 | 100 | 70 | | | 140 | 4300 | 1 | 1 | 111 |
| 7.5 | 5.0 | 7.5 | 4.20 | 100 | 50 | | | 190 | 4300 | 1 | 1 | 111 |
| 7.5 | 7.5 | 7.5 | 4.25 | 80 | 70 | .10 | 5.0 | 550 | 4300 | 1 | 1 | 111 |
| 15.0 | 10.0 | 10.0 | 4.10 | 120 | 70 | .15 | 1.0 | 620 | 4300 | 1 | 1 | 112 |
| 7.5 | 7.5 | 7.5 | 4.25 | 80 | 10 | .40 | 2.5 | 440 | 4300 | 1 | 1 | 113 |
| 7.5 | 10.0 | 10.0 | 3.90 | 140 | 30 | .30 | 1.0 | 450 | 4300 | 1 | 1 | 113 |
| 7.5 | 5.0 | 10.0 | 4.20 | 100 | 50 | .40 | 5.0 | 240 | 4300 | 1 | 1 | 121 |
| 15.0 | 10.0 | 15.0 | 4.00 | 120 | 30 | | | 500 | 4300 | 1 | 1 | 122 |
| 7.5 | 10.0 | 5.0 | 4.25 | 120 | 30 | .10 | 1.0 | 570 | 4300 | 1 | 1 | 133 |
| 7.5 | 10.0 | 10.0 | 4.10 | 100 | 30 | .08 | 5.0 | 700 | 4300 | 1 | 1 | 133 |
| 7.5 | 10.0 | 10.0 | 3.50 | 140 | 30 | | | 90 | 4400 | 1 | 1 | 111 |
| 7.5 | 10.0 | 10.0 | 4.10 | 100 | 10 | .02 | 2.5 | 100 | 4400 | 1 | 1 | 111 |
| 7.5 | 5.0 | 10.0 | 4.20 | 100 | 10 | | | 130 | 4400 | 1 | 1 | 111 |
| 7.5 | 10.0 | 10.0 | 3.70 | 140 | 30 | .15 | 1.0 | 130 | 4400 | 1 | 1 | 111 |
| 7.5 | 5.0 | 10.0 | 4.20 | 100 | 70 | .40 | 5.0 | 230 | 4400 | 1 | 1 | 111 |
| 7.5 | 5.0 | 5.0 | 4.25 | 80 | 30 | .10 | 5.0 | 420 | 4400 | 1 | 1 | 111 |
| 7.5 | 7.5 | 7.5 | 4.00 | 80 | 10 | .20 | 1.0 | 140 | 4400 | 1 | 1 | 113 |
| 15.0 | 10.0 | 15.0 | 4.00 | 120 | 40 | .06 | 1.0 | 220 | 4400 | 1 | 1 | 122 |
| 7.5 | 5.0 | 5.0 | 4.25 | 100 | 10 | .40 | 1.0 | 270 | 4400 | 1 | 1 | 122 |
| 7.5 | 10.0 | 10.0 | 4.10 | 100 | 10 | .04 | 1.0 | 290 | 4400 | 1 | 1 | 122 |
| 7.5 | 7.5 | 7.5 | 4.40 | 120 | 70 | .04 | 1.0 | 460 | 4400 | 1 | 1 | 122 |
| 7.5 | 10.0 | 10.0 | 4.10 | 90 | 10 | .15 | 5.0 | 580 | 4400 | 1 | 1 | 122 |
| 7.5 | 10.0 | 5.0 | 4.25 | 100 | 30 | .10 | 1.0 | 600 | 4400 | 1 | 1 | 122 |
| 7.5 | 10.0 | 10.0 | 4.10 | 120 | 30 | .08 | 1.0 | 500 | 4400 | 1 | 1 | 123 |
| 7.5 | 10.0 | 5.0 | 4.25 | 100 | 10 | .10 | 1.0 | 560 | 4400 | 1 | 1 | 123 |
| 7.5 | 10.0 | 10.0 | 3.90 | 140 | 70 | .09 | 2.5 | 630 | 4400 | 1 | 1 | 133 |
| 7.5 | 10.0 | 10.0 | 3.50 | 100 | 10 | | | 90 | 4500 | 1 | 1 | 111 |
| 7.5 | 10.0 | 10.0 | 3.50 | 120 | 30 | .04 | 1.0 | 90 | 4500 | 1 | 1 | 111 |
| 7.5 | 10.0 | 10.0 | 3.90 | 120 | 10 | .08 | 1.0 | 100 | 4500 | 1 | 1 | 111 |
| 7.5 | 5.0 | 7.5 | 4.20 | 140 | 30 | | | 170 | 4500 | 1 | 1 | 111 |
| 7.5 | 5.0 | 7.5 | 4.20 | 140 | 50 | .40 | 5.0 | 170 | 4500 | 1 | 1 | 111 |
| 7.5 | 5.0 | 7.5 | 4.20 | 100 | 70 | .30 | 5.0 | 220 | 4500 | 1 | 1 | 111 |
| 7.5 | 10.0 | 5.0 | 4.25 | 80 | 10 | .40 | 5.0 | 600 | 4500 | 1 | 1 | 111 |
| 7.5 | 7.5 | 7.5 | 4.25 | 90 | 10 | .10 | 1.0 | 150 | 4500 | 1 | 1 | 113 |
| 7.5 | 10.0 | 10.0 | 3.90 | 140 | 50 | .15 | 1.0 | 510 | 4500 | 1 | 1 | 113 |
| 7.5 | 10.0 | 10.0 | 3.70 | 140 | 50 | .15 | 1.0 | 330 | 4500 | 1 | 1 | 122 |
| 7.5 | 10.0 | 10.0 | 4.10 | 100 | 10 | .15 | 1.0 | 550 | 4500 | 1 | 1 | 122 |
| 7.5 | 10.0 | 10.0 | 4.10 | 90 | 10 | .08 | 2.5 | 410 | 4500 | 1 | 1 | 123 |
| 7.5 | 10.0 | 10.0 | 4.10 | 90 | 10 | .08 | 1.0 | 420 | 4500 | 1 | 1 | 123 |
| 7.5 | 10.0 | 10.0 | 4.10 | 140 | 70 | .30 | 1.0 | 530 | 4500 | 1 | 1 | 123 |
| 7.5 | 7.5 | 7.5 | 4.25 | 80 | 20 | .20 | 2.5 | 590 | 4500 | 1 | 1 | 123 |
| 7.5 | 10.0 | 10.0 | 4.10 | 90 | 30 | .08 | 5.0 | 650 | 4500 | 1 | 1 | 123 |
| 7.5 | 10.0 | 10.0 | 4.10 | 100 | 10 | .04 | 2.5 | 250 | 4500 | 1 | 1 | 132 |
| 7.5 | 7.5 | 7.5 | 4.25 | 120 | 20 | .20 | 1.0 | 560 | 4500 | 1 | 1 | 132 |
| 7.5 | 10.0 | 10.0 | 4.10 | 100 | 10 | .02 | 1.0 | 130 | 4600 | 1 | 1 | 111 |
| 7.5 | 3.0 | 7.5 | 4.50 | 120 | 70 | | | 140 | 4600 | 1 | 1 | 111 |
| 7.5 | 10.0 | 10.0 | 3.90 | 100 | 30 | .02 | 5.0 | 140 | 4600 | 1 | 1 | 111 |
| 7.5 | 5.0 | 10.0 | 4.20 | 100 | 50 | | | 190 | 4600 | 1 | 1 | 111 |
| 7.5 | 5.0 | 7.5 | 4.20 | 100 | 70 | .10 | 1.0 | 270 | 4600 | 1 | 1 | 111 |
| 7.5 | 5.0 | 7.5 | 4.20 | 100 | 50 | .40 | 5.0 | 300 | 4600 | 1 | 1 | 111 |
| 7.5 | 7.5 | 7.5 | 4.25 | 80 | 70 | | | 330 | 4600 | 1 | 1 | 111 |
| 7.5 | 7.5 | 7.5 | 4.25 | 80 | 50 | .10 | 2.5 | 430 | 4600 | 1 | 1 | 111 |
| 7.5 | 10.0 | 10.0 | 4.10 | 90 | 30 | .08 | 2.5 | 600 | 4600 | 1 | 1 | 111 |
| 7.5 | 5.0 | 7.5 | 4.20 | 100 | 30 | | | 140 | 4600 | 1 | 1 | 112 |
| 7.5 | 7.5 | 7.5 | 4.40 | 120 | 70 | .08 | 1.0 | 440 | 4600 | 1 | 1 | 112 |
| 15.0 | 10.0 | 10.0 | 4.10 | 120 | 70 | .03 | 1.0 | 690 | 4600 | 1 | 1 | 112 |
| 7.5 | 5.0 | 10.0 | 4.20 | 120 | 30 | .40 | 5.0 | 120 | 4600 | 1 | 1 | 113 |
| 7.5 | 5.0 | 7.5 | 4.20 | 100 | 30 | .10 | 1.0 | 150 | 4600 | 1 | 1 | 113 |
| 7.5 | 7.5 | 7.5 | 4.25 | 120 | 50 | .20 | 1.0 | 680 | 4600 | 1 | 1 | 133 |
| 7.5 | 7.5 | 7.5 | 4.25 | 120 | 50 | .20 | 2.5 | 610 | 4600 | 1 | 1 | 133 |
| 7.5 | 10.0 | 10.0 | 3.70 | 120 | 30 | .04 | 5.0 | 90 | 4700 | 1 | 1 | 111 |
| 7.5 | 10.0 | 10.0 | 3.90 | 100 | 10 | .02 | 1.0 | 95 | 4700 | 1 | 1 | 111 |
| 7.5 | 10.0 | 10.0 | 3.70 | 140 | 30 | .08 | 1.0 | 100 | 4700 | 1 | 1 | 111 |
| 7.5 | 7.5 | 7.5 | 4.00 | 120 | 30 | .10 | 1.0 | 130 | 4700 | 1 | 1 | 111 |
| 7.5 | 5.0 | 7.5 | 4.20 | 140 | 70 | | | 140 | 4700 | 1 | 1 | 111 |
| 7.5 | 5.0 | 7.5 | 4.20 | 140 | 50 | | | 160 | 4700 | 1 | 1 | 111 |

APPENDIX-continued

TABLE I

| TKNS | ELECTROLYTE | | | CURRENT | | | | HYSTER. PROP. | | LOOP ANALYSIS | | |
|---|---|---|---|---|---|---|---|---|---|---|---|---|
| | CO | ADD. | PH | T | CD | P | PD | HC | BY | A | P | L |
| 7.5 | 5.0 | 7.5 | 4.20 | 140 | 70 | .30 | 5.0 | 160 | 4700 | 1 | 1 | 111 |
| 7.5 | 5.0 | 7.5 | 4.20 | 120 | 50 | .40 | 5.0 | 200 | 4700 | 1 | 1 | 111 |
| 7.5 | 5.0 | 10.0 | 4.20 | 100 | 30 | | | 230 | 4700 | 1 | 1 | 111 |
| 7.5 | 5.0 | 10.0 | 4.20 | 100 | 70 | .10 | 1.0 | 270 | 4700 | 1 | 1 | 111 |
| 7.5 | 5.0 | 10.0 | 3.90 | 120 | 70 | | | 290 | 4700 | 1 | 1 | 111 |
| 7.5 | 5.0 | 10.0 | 3.90 | 120 | 50 | | | 310 | 4700 | 1 | 1 | 111 |
| 7.5 | 5.0 | 10.0 | 4 14 | 120 | 50 | | | 340 | 4700 | 1 | 1 | 111 |
| 7.5 | 5.0 | 5.0 | 4.25 | 100 | 30 | | | 350 | 4700 | 1 | 1 | 111 |
| 7.5 | 10.0 | 10.0 | 3.50 | 100 | 50 | | | 350 | 4700 | 1 | 1 | 111 |
| 7.5 | 5.0 | 5.0 | 4.25 | 120 | 30 | .40 | 5.0 | 400 | 4700 | 1 | 1 | 111 |
| 7.5 | 10.0 | 10.0 | 3.50 | 100 | 70 | .30 | 1.0 | 430 | 4700 | 1 | 1 | 111 |
| 7.5 | 7.5 | 7.5 | 4.25 | 90 | 20 | .40 | 5.0 | 590 | 4700 | 1 | 1 | 111 |
| 7.5 | 5.0 | 5.0 | 4.25 | 120 | 30 | .10 | 1.0 | 400 | 4700 | 1 | 1 | 112 |
| 7.5 | 10.0 | 10.0 | 3.90 | 140 | 50 | .12 | 1.0 | 490 | 4700 | 1 | 1 | 112 |
| 7.5 | 10.0 | 10.0 | 3.90 | 120 | 50 | .15 | 5.0 | 550 | 4700 | 1 | 1 | 112 |
| 7.5 | 10.0 | 10.0 | 3.90 | 140 | 70 | .09 | 1.0 | 550 | 4700 | 1 | 1 | 112 |
| 7.5 | 7.5 | 7.5 | 4.40 | 120 | 30 | | | 410 | 4700 | 1 | 1 | 121 |
| 7.5 | 10.0 | 10.0 | 3.70 | 140 | 50 | .30 | 1.0 | 400 | 4700 | 1 | 1 | 122 |
| 7.5 | 5.0 | 5.0 | 4.25 | 120 | 50 | .10 | 5.0 | 510 | 4700 | 1 | 1 | 122 |
| 7.5 | 10.0 | 10.0 | 4.10 | 100 | 10 | | | 540 | 4700 | 1 | 1 | 122 |
| 7.5 | 10.0 | 10.0 | 4.10 | 90 | 10 | .15 | 2.5 | 570 | 4700 | 1 | 1 | 122 |
| 15.0 | 10.0 | 15.0 | 4.00 | 120 | 40 | | | 580 | 4700 | 1 | 1 | 122 |
| 7.5 | 10.0 | 10.0 | 3.90 | 120 | 50 | .15 | 10.0 | 620 | 4700 | 1 | 1 | 122 |
| 7.5 | 10.0 | 5.0 | 4.25 | 120 | 30 | .40 | 5.0 | 500 | 4700 | 1 | 1 | 123 |
| 7.5 | 7.5 | 7.5 | 4.25 | 120 | 20 | .40 | 5.0 | 570 | 4700 | 1 | 1 | 123 |
| 7.5 | 10.0 | 10.0 | 4.10 | 100 | 30 | .04 | 1.0 | 620 | 4700 | 1 | 1 | 133 |
| 7.5 | 10.0 | 10.0 | 4.10 | 100 | 30 | .04 | 1.0 | 490 | 4700 | 1 | 1 | 223 |
| 7.5 | 10.0 | 10.0 | 3.50 | 100 | 30 | .04 | 1.0 | 90 | 4800 | 1 | 1 | 111 |
| 7.5 | 10.0 | 10.0 | 3.70 | 120 | 30 | .04 | 2.5 | 90 | 4800 | 1 | 1 | 111 |
| 15.0 | 10.0 | 15.0 | 4.00 | 120 | 30 | .02 | 1.0 | 100 | 4800 | 1 | 1 | 111 |
| 7.5 | 3.0 | 5.0 | 4.50 | 120 | 70 | | | 140 | 4800 | 1 | 1 | 111 |
| 7.5 | 5.0 | 10.0 | 4.20 | 140 | 70 | .40 | 5.0 | 170 | 4800 | 1 | 1 | 111 |
| 7.5 | 10.0 | 10.0 | 3.70 | 140 | 50 | .08 | 1.0 | 180 | 4800 | 1 | 1 | 111 |
| 7.5 | 5.0 | 7.5 | 4.20 | 120 | 70 | .10 | 1.0 | 210 | 4800 | 1 | 1 | 111 |
| 7.5 | 5.0 | 10.0 | 4.14 | 120 | 70 | | | 270 | 4800 | 1 | 1 | 111 |
| 7.5 | 10.0 | 10.0 | 3.50 | 100 | 70 | .15 | 1.0 | 360 | 4800 | 1 | 1 | 111 |
| 7.5 | 10.0 | 10.0 | 3.70 | 100 | 50 | .30 | 1.0 | 360 | 4800 | 1 | 1 | 111 |
| 7.5 | 10.0 | 10.0 | 3.70 | 100 | 70 | .09 | 1.0 | 360 | 4800 | 1 | 1 | 111 |
| 7.5 | 5.0 | 5.0 | 4.25 | 100 | 30 | .10 | 1.0 | 380 | 4800 | 1 | 1 | 111 |
| 7.5 | 7.5 | 7.5 | 4.40 | 120 | 50 | | | 400 | 4800 | 1 | 1 | 111 |
| 7.5 | 10.0 | 10.0 | 4.10 | 90 | 70 | .09 | 1.0 | 410 | 4800 | 1 | 1 | 111 |
| 7.5 | 7.5 | 7.5 | 4.25 | 80 | 50 | .10 | 5.0 | 510 | 4800 | 1 | 1 | 111 |
| 7.5 | 10.0 | 5.0 | 4.25 | 80 | 30 | .10 | 5.0 | 520 | 4800 | 1 | 1 | 111 |
| 7.5 | 10.0 | 10.0 | 4.10 | 90 | 50 | .08 | 5.0 | 580 | 4800 | 1 | 1 | 111 |
| 7.5 | 10.0 | 10.0 | 3.90 | 120 | 30 | .08 | 1.0 | 420 | 4800 | 1 | 1 | 112 |
| 7.5 | 10.0 | 10.0 | 4.10 | 90 | 10 | .15 | 1.0 | 570 | 4800 | 1 | 1 | 112 |
| 7.5 | 10.0 | 5.0 | 4.25 | 80 | 10 | .40 | 5.0 | 600 | 4800 | 1 | 1 | 112 |
| 7.5 | 10.0 | 10.0 | 3.90 | 140 | 70 | .09 | 1.0 | 530 | 4800 | 1 | 1 | 113 |
| 7.5 | 10.0 | 10.0 | 4.10 | 90 | 10 | .04 | 2.5 | 160 | 4800 | 1 | 1 | 122 |
| 7.5 | 10.0 | 10.0 | 4.10 | 100 | 30 | .08 | 2.5 | 470 | 4800 | 1 | 1 | 122 |
| 15.0 | 10.0 | 15.0 | 4.10 | 120 | 30 | | | 520 | 4800 | 1 | 1 | 122 |
| 7.5 | 10.0 | 5.0 | 4.25 | 100 | 10 | .40 | 5.0 | 600 | 4800 | 1 | 1 | 122 |
| 7.5 | 7.5 | 7.5 | 4.25 | 100 | 10 | .20 | 1.0 | 710 | 4800 | 1 | 1 | 122 |
| 7.5 | 10.0 | 5.0 | 4.25 | 120 | 50 | .10 | 5.0 | 690 | 4800 | 1 | 1 | 123 |
| 7.5 | 7.5 | 7.5 | 4.25 | 120 | 50 | .40 | 2.5 | 750 | 4800 | 1 | 1 | 133 |
| 7.5 | 5.0 | 7.5 | 4.20 | 120 | 70 | | | 140 | 4900 | 1 | 1 | 111 |
| 7.5 | 5.0 | 10.0 | 4.20 | 120 | 70 | | | 140 | 4900 | 1 | 1 | 111 |
| 7.5 | 5.0 | 10.0 | 4.20 | 120 | 50 | | | 150 | 4900 | 1 | 1 | 111 |
| 7.5 | 5.0 | 10.0 | 4.20 | 140 | 50 | | | 150 | 4900 | 1 | 1 | 111 |
| 7.5 | 5.0 | 7.5 | 4.20 | 120 | 50 | | | 160 | 4900 | 1 | 1 | 111 |
| 7.5 | 3.0 | 5.0 | 4.50 | 120 | 50 | | | 200 | 4900 | 1 | 1 | 111 |
| 7.5 | 3.0 | 5.0 | 4.50 | 120 | 30 | | | 230 | 4900 | 1 | 1 | 111 |
| 7.5 | 5.0 | 10.0 | 4.15 | 120 | 30 | | | 310 | 4900 | 1 | 1 | 111 |
| 7.5 | 3.0 | 7.5 | 4.50 | 120 | 50 | | | 330 | 4900 | 1 | 1 | 111 |
| 7.5 | 10.0 | 10.0 | 3.70 | 100 | 70 | .15 | 1.0 | 350 | 4900 | 1 | 1 | 111 |
| 7.5 | 5.0 | 5.0 | 4.25 | 100 | 50 | .10 | 5.0 | 410 | 4900 | 1 | 1 | 111 |
| 7.5 | 10.0 | 10.0 | 4.10 | 100 | 50 | .15 | 10.0 | 620 | 4900 | 1 | 1 | 111 |
| 7.5 | 5.0 | 5.0 | 4.25 | 80 | 10 | .40 | 5.0 | 390 | 4900 | 1 | 1 | 112 |
| 15.0 | 10.0 | 10.0 | 4.10 | 120 | 50 | .05 | 1.0 | 570 | 4900 | 1 | 1 | 112 |
| 7.5 | 10.0 | 10.0 | 3.90 | 120 | 50 | .11 | 10.0 | 580 | 4900 | 1 | 1 | 112 |
| 15.0 | 10.0 | 10.0 | 4.15 | 120 | 70 | .10 | 1.0 | 600 | 4900 | 1 | 1 | 112 |
| 7.5 | 5.0 | 5.0 | 4.25 | 100 | 30 | .40 | 5.0 | 400 | 4900 | 1 | 1 | 121 |
| 7.5 | 10.0 | 10.0 | 3.90 | 120 | 50 | .08 | 5.0 | 620 | 4900 | 1 | 1 | 122 |
| 7.5 | 7.5 | 7.5 | 4.25 | 90 | 10 | .40 | 2.5 | 430 | 4900 | 1 | 1 | 123 |
| 7.5 | 7.5 | 7.5 | 4.25 | 90 | 20 | .20 | 2.5 | 510 | 4900 | 1 | 1 | 123 |
| 7.5 | 7.5 | 10.0 | 4.10 | 140 | 70 | | | 530 | 4900 | 1 | 1 | 123 |
| 7.5 | 7.5 | 7.5 | 4.25 | 120 | 30 | .40 | 5.0 | 660 | 4900 | 1 | 1 | 132 |
| 7.5 | 7.5 | 7.5 | 4.25 | 120 | 70 | .20 | 5.0 | 800 | 4900 | 1 | 1 | 133 |
| 7.5 | 10.0 | 10.0 | 3.50 | 140 | 50 | .08 | 1.0 | 90 | 5000 | 1 | 1 | 111 |
| 7.5 | 10.0 | 10.0 | 3.70 | 100 | 30 | .04 | 1.0 | 120 | 5000 | 1 | 1 | 111 |
| 7.5 | 5.0 | 7.5 | 4.20 | 120 | 30 | | | 170 | 5000 | 1 | 1 | 111 |
| 7.5 | 5.0 | 7.5 | 4.20 | 120 | 70 | .30 | 5.0 | 190 | 5000 | 1 | 1 | 111 |
| 7.5 | 5.0 | 5.0 | 4.25 | 120 | 10 | | | 300 | 5000 | 1 | 1 | 111 |
| 7.5 | 7.5 | 7.5 | 4.00 | 100 | 70 | .30 | 5.0 | 300 | 5000 | 1 | 1 | 111 |
| 7.5 | 5.0 | 5.0 | 4.25 | 100 | 50 | | | 340 | 5000 | 1 | 1 | 111 |
| 7.5 | 10.0 | 10.0 | 3.50 | 100 | 70 | | | 360 | 5000 | 1 | 1 | 111 |

APPENDIX-continued

TABLE 1

| TKNS | ELECTROLYTE | | | CURRENT | | | | HYSTER. PROP. | | LOOP ANALYSIS | | |
|---|---|---|---|---|---|---|---|---|---|---|---|---|
| | CO | ADD. | PH | T | CD | P | PD | HC | BY | A | P | L |
| 7.5 | 10.0 | 10.0 | 3.70 | 100 | 70 | .30 | 1.0 | 360 | 5000 | 1 | 1 | 111 |
| 7.5 | 7.5 | 7.5 | 4.25 | 90 | 70 | .10 | 5.0 | 470 | 5000 | 1 | 1 | 111 |
| 7.5 | 7.5 | 7.5 | 4.25 | 80 | 20 | .20 | 1.0 | 530 | 5000 | 1 | 1 | 111 |
| 7.5 | 10.0 | 10.0 | 4.10 | 90 | 50 | .08 | 2.5 | 530 | 5000 | 1 | 1 | 111 |
| 7.5 | 10.0 | 10.0 | 4.10 | 90 | 30 | .08 | 1.0 | 550 | 5000 | 1 | 1 | 111 |
| 7.5 | 7.5 | 7.5 | 4.25 | 90 | 20 | .40 | 2.5 | 560 | 5000 | 1 | 1 | 111 |
| 7.5 | 7.5 | 7.5 | 4.25 | 80 | 20 | .40 | 5.0 | 590 | 5000 | 1 | 1 | 111 |
| 7.5 | 5.0 | 5.0 | 4.25 | 80 | 10 | .40 | 1.0 | 380 | 5000 | 1 | 1 | 112 |
| 7.5 | 10.0 | 10.0 | 3.70 | 140 | 70 | .09 | 1.0 | 380 | 5000 | 1 | 1 | 112 |
| 7.5 | 10.0 | 10.0 | 3.70 | 140 | 70 | .09 | 1.0 | 380 | 5000 | 1 | 1 | 112 |
| 7.5 | 10.0 | 10.0 | 3.90 | 140 | 30 | | | 410 | 5000 | 1 | 1 | 112 |
| 15.0 | 10.0 | 7.5 | 4.15 | 120 | 70 | .40 | 5.0 | 620 | 5000 | 1 | 1 | 113 |
| 7.5 | 7.5 | 7.5 | 4.40 | 120 | 70 | .16 | 1.0 | 480 | 5000 | 1 | 1 | 122 |
| 7.5 | 7.5 | 7.5 | 4.25 | 100 | 10 | .40 | 5.0 | 640 | 5000 | 1 | 1 | 122 |
| 7.5 | 7.5 | 7.5 | 4.25 | 100 | 20 | .10 | 1.0 | 640 | 5000 | 1 | 1 | 122 |
| 7.5 | 10.0 | 10.0 | 4.10 | 100 | 30 | .15 | 10.0 | 660 | 5000 | 1 | 1 | 122 |
| 7.5 | 10.0 | 10.0 | 4.10 | 100 | 50 | .08 | 5.0 | 690 | 5000 | 1 | 1 | 122 |
| 7.5 | 10.0 | 10.0 | 3.70 | 120 | 70 | .09 | 5.0 | 270 | 5000 | 1 | 1 | 123 |
| 7.5 | 10.0 | 10.0 | 4.10 | 120 | 30 | .15 | 1.0 | 510 | 5000 | 1 | 1 | 123 |
| 7.5 | 7.5 | 7.5 | 4.25 | 120 | 30 | .20 | 1.0 | 610 | 5000 | 1 | 1 | 132 |
| 7.5 | 7.5 | 7.5 | 4.00 | 120 | 50 | .40 | 5.0 | 710 | 5000 | 1 | 1 | 133 |
| 7.5 | 10.0 | 10.0 | 3.70 | 100 | 10 | .04 | 1.0 | 100 | 5100 | 1 | 1 | 111 |
| 7.5 | 10.0 | 10.0 | 4.10 | 100 | 10 | .04 | 5.0 | 120 | 5100 | 1 | 1 | 111 |
| 7.5 | 5.0 | 7.5 | 4.20 | 120 | 50 | .10 | 1.0 | 190 | 5100 | 1 | 1 | 111 |
| 7.5 | 5.0 | 10.0 | 4.20 | 120 | 50 | .40 | 5.0 | 190 | 5100 | 1 | 1 | 111 |
| 7.5 | 5.0 | 10.0 | 4.20 | 120 | 70 | .40 | 5.0 | 200 | 5100 | 1 | 1 | 111 |
| 7.5 | 5.0 | 7.5 | 4.15 | 120 | 50 | | | 270 | 5100 | 1 | 1 | 111 |
| 7.5 | 7.5 | 7.5 | 4.40 | 120 | 70 | | | 320 | 5100 | 1 | 1 | 111 |
| 7.5 | 7.5 | 7.5 | 4.00 | 100 | 50 | .10 | 1.0 | 340 | 5100 | 1 | 1 | 111 |
| 7.5 | 5.0 | 5.0 | 4.25 | 80 | 30 | .10 | 1.0 | 400 | 5100 | 1 | 1 | 111 |
| 7.5 | 7.5 | 10.0 | 3.90 | 100 | 70 | .10 | 1.0 | 400 | 5100 | 1 | 1 | 111 |
| 7.5 | 7.5 | 7.5 | 4.25 | 80 | 70 | .10 | 2.5 | 470 | 5100 | 1 | 1 | 111 |
| 7.5 | 7.5 | 7.5 | 4.25 | 80 | 50 | .20 | 1.0 | 490 | 5100 | 1 | 1 | 111 |
| 7.5 | 10.0 | 10.0 | 4.10 | 90 | 70 | .09 | 5.0 | 510 | 5100 | 1 | 1 | 111 |
| 7.5 | 7.5 | 7.5 | 4.25 | 80 | 20 | | | 530 | 5100 | 1 | 1 | 111 |
| 7.5 | 10.0 | 10.0 | 3.90 | 140 | 50 | .23 | 1.0 | 470 | 5100 | 1 | 1 | 112 |
| 7.5 | 10.0 | 10.0 | 3.90 | 120 | 50 | .11 | 5.0 | 590 | 5100 | 1 | 1 | 112 |
| 7.5 | 10.0 | 10.0 | 4.15 | 120 | 70 | .40 | 5.0 | 600 | 5100 | 1 | 1 | 112 |
| 7.5 | 10.0 | 10.0 | 3.90 | 120 | 30 | .15 | 5.0 | 520 | 5100 | 1 | 1 | 122 |
| 7.5 | 10.0 | 5.0 | 4.25 | 100 | 30 | .20 | 5.0 | 620 | 5100 | 1 | 1 | 122 |
| 7.5 | 10.0 | 5.0 | 4.25 | 120 | 10 | | | 430 | 5100 | 1 | 1 | 123 |
| 7.5 | 7.5 | 7.5 | 4.25 | 120 | 10 | .40 | 1.0 | 460 | 5100 | 1 | 1 | 123 |
| 7.5 | 10.0 | 10.0 | 3.90 | 100 | 30 | .02 | 1.0 | 250 | 5100 | 1 | 1 | 132 |
| 7.5 | 10.0 | 10.0 | 3.70 | 120 | 30 | .04 | 1.0 | 90 | 5200 | 1 | 1 | 111 |
| 7.5 | 10.0 | 10.0 | 3.50 | 100 | 30 | .08 | 1.0 | 100 | 5200 | 1 | 1 | 111 |
| 7.5 | 10.0 | 10.0 | 3.50 | 100 | 50 | .08 | 1.0 | 110 | 5200 | 1 | 1 | 111 |
| 7.5 | 10.0 | 10.0 | 4.10 | 90 | 10 | .02 | 1.0 | 140 | 5200 | 1 | 1 | 111 |
| 7.5 | 10.0 | 10.0 | 3.50 | 100 | 70 | .08 | 1.0 | 180 | 5200 | 1 | 1 | 111 |
| 7.5 | 7.5 | 7.5 | 4.00 | 100 | 70 | | | 200 | 5200 | 1 | 1 | 111 |
| 7.5 | 5.0 | 7.5 | 4.15 | 120 | 70 | | | 230 | 5200 | 1 | 1 | 111 |
| 7.5 | 7.5 | 7.5 | 4.00 | 100 | 50 | .40 | 5.0 | 330 | 5200 | 1 | 1 | 111 |
| 10.0 | 7.5 | 10.0 | 3.90 | 100 | 70 | | | 350 | 5200 | 1 | 1 | 111 |
| 7.5 | 5.0 | 5.0 | 4.25 | 80 | 30 | .10 | 1.0 | 380 | 5200 | 1 | 1 | 111 |
| 7.5 | 5.0 | 5.0 | 4.25 | 120 | 30 | .40 | 1.0 | 380 | 5200 | 1 | 1 | 111 |
| 7.5 | 5.0 | 5.0 | 4.25 | 80 | 30 | .40 | 5.0 | 400 | 5200 | 1 | 1 | 111 |
| 7.5 | 10.0 | 10.0 | 3.70 | 140 | 70 | .15 | 1.0 | 410 | 5200 | 1 | 1 | 111 |
| 7.5 | 7.5 | 7.5 | 4.25 | 80 | 70 | .20 | 5.0 | 420 | 5200 | 1 | 1 | 111 |
| 7.5 | 10.0 | 5.0 | 4.25 | 100 | 50 | .40 | 5.0 | 460 | 5200 | 1 | 1 | 111 |
| 7.5 | 10.0 | 10.0 | 4.10 | 90 | 70 | .09 | 2.5 | 470 | 5200 | 1 | 1 | 111 |
| 7.5 | 10.0 | 10.0 | 4.10 | 90 | 70 | .30 | 10.0 | 480 | 5200 | 1 | 1 | 111 |
| 7.5 | 10.0 | 10.0 | 4.10 | 90 | 50 | .15 | 5.0 | 500 | 5200 | 1 | 1 | 111 |
| 15.0 | 10.0 | 15.0 | 4.10 | 120 | 50 | | | 630 | 5200 | 1 | 1 | 111 |
| 7.5 | 7.5 | 7.5 | 4.00 | 100 | 50 | | | 280 | 5200 | 1 | 1 | 112 |
| 7.5 | 7.5 | 10.0 | 3.90 | 100 | 50 | .10 | 1.0 | 380 | 5200 | 1 | 1 | 112 |
| 7.5 | 7.5 | 7.5 | 4.25 | 90 | 10 | .40 | 1.0 | 450 | 5200 | 1 | 1 | 112 |
| 7.5 | 10.0 | 10.0 | 3.90 | 120 | 50 | .06 | 1.0 | 480 | 5200 | 1 | 1 | 112 |
| 7.5 | 10.0 | 10.0 | 3.90 | 120 | 50 | .11 | 2.5 | 530 | 5200 | 1 | 1 | 112 |
| 7.5 | 10.0 | 10.0 | 3.90 | 140 | 70 | .15 | 2.5 | 530 | 5200 | 1 | 1 | 112 |
| 15.0 | 10.0 | 10.0 | 4.10 | 120 | 70 | .05 | 1.0 | 580 | 5200 | 1 | 1 | 112 |
| 15.0 | 10.0 | 10.0 | 4.10 | 120 | 50 | .08 | 1.0 | 590 | 5200 | 1 | 1 | 112 |
| 7.5 | 5.0 | 10.0 | 4.20 | 100 | 30 | .10 | 1.0 | 140 | 5200 | 1 | 1 | 113 |
| 7.5 | 5.0 | 10.0 | 4.20 | 100 | 30 | .40 | 5.0 | 150 | 5200 | 1 | 1 | 113 |
| 7.5 | 5.0 | 10.0 | 4.20 | 120 | 50 | .10 | 1.0 | 170 | 5200 | 1 | 1 | 113 |
| 7.5 | 10.0 | 10.0 | 3.90 | 120 | 30 | .04 | 1.0 | 240 | 5200 | 1 | 1 | 121 |
| 7.5 | 5.0 | 10.0 | 4.15 | 120 | 70 | | | 270 | 5200 | 1 | 1 | 122 |
| 7.5 | 5.0 | 5.0 | 4.40 | 120 | 50 | .05 | 1.0 | 500 | 5200 | 1 | 1 | 122 |
| 7.5 | 10.0 | 10.0 | 4.10 | 120 | 30 | .15 | 1.0 | 530 | 5200 | 1 | 1 | 122 |
| 7.5 | 10.0 | 10.0 | 3.90 | 120 | 50 | .08 | 2.5 | 550 | 5200 | 1 | 1 | 122 |
| 7.5 | 10.0 | 10.0 | 4.10 | 100 | 30 | .08 | 1.0 | 600 | 5200 | 1 | 1 | 122 |
| 7.5 | 10.0 | 5.0 | 4.25 | 100 | 30 | .10 | 5.0 | 680 | 5200 | 1 | 1 | 122 |
| 7.5 | 10.0 | 10.0 | 4.10 | 140 | 70 | | | 530 | 5200 | 1 | 1 | 123 |
| 7.5 | 10.0 | 10.0 | 3.50 | 120 | 30 | .08 | 1.0 | 90 | 5300 | 1 | 1 | 111 |
| 7.5 | 10.0 | 10.0 | 3.70 | 100 | 30 | .08 | 1.0 | 150 | 5300 | 1 | 1 | 111 |
| 7.5 | 5.0 | 10.0 | 4.20 | 100 | 50 | .10 | 1.0 | 190 | 5300 | 1 | 1 | 111 |
| 7.5 | 7.5 | 7.5 | 4.00 | 120 | 70 | | | 270 | 5300 | 1 | 1 | 111 |
| 7.5 | 5.0 | 5.0 | 4.25 | 100 | 50 | .40 | 5.0 | 350 | 5300 | 1 | 1 | 111 |

APPENDIX-continued

TABLE I

| TKNS | ELECTROLYTE | | | CURRENT | | | | HYSTER. PROP. | | LOOP ANALYSIS | | |
|---|---|---|---|---|---|---|---|---|---|---|---|---|
| | CO | ADD. | PH | T | CD | P | PD | HC | BY | A | P | L |
| 7.5 | 10.0 | 10.0 | 3.70 | 100 | 50 | | | 360 | 5300 | 1 | 1 | 111 |
| 7.5 | 10.0 | 10.0 | 3.70 | 100 | 70 | | | 360 | 5300 | 1 | 1 | 111 |
| 7.5 | 5.0 | 5.0 | 4.25 | 100 | 50 | .40 | 5.0 | 370 | 5300 | 1 | 1 | 111 |
| 7.5 | 10.0 | 10.0 | 3.90 | 100 | 70 | .09 | 1.0 | 380 | 5300 | 1 | 1 | 111 |
| 7.5 | 7.5 | 10.0 | 3.90 | 100 | 50 | | | 390 | 5300 | 1 | 1 | 111 |
| 7.5 | 7.5 | 7.5 | 4.25 | 80 | 70 | .10 | 1.0 | 410 | 5300 | 1 | 1 | 111 |
| 7.5 | 7.5 | 7.5 | 4.25 | 90 | 70 | .10 | 2.5 | 410 | 5300 | 1 | 1 | 111 |
| 7.5 | 7.5 | 7.5 | 4.25 | 80 | 50 | .20 | 5.0 | 430 | 5300 | 1 | 1 | 111 |
| 7.5 | 7.5 | 7.5 | 4.25 | 80 | 50 | .10 | 1.0 | 440 | 5300 | 1 | 1 | 111 |
| 7.5 | 7.5 | 7.5 | 4.25 | 80 | 70 | .30 | 2.5 | 460 | 5300 | 1 | 1 | 111 |
| 7.5 | 10.0 | 10.0 | 4.10 | 90 | 50 | .08 | 1.0 | 470 | 5300 | 1 | 1 | 111 |
| 7.5 | 10.0 | 10.0 | 4.10 | 90 | 50 | .15 | 2.5 | 480 | 5300 | 1 | 1 | 111 |
| 7.5 | 10.0 | 10.0 | 4.10 | 90 | 30 | .15 | 1.0 | 510 | 5300 | 1 | 1 | 111 |
| 7.5 | 10.0 | 10.0 | 4.10 | 100 | 50 | .15 | 5.0 | 580 | 5300 | 1 | 1 | 111 |
| 7.5 | 7.5 | 7.5 | 4.25 | 80 | 20 | .40 | 1.0 | 600 | 5300 | 1 | 1 | 111 |
| 7.5 | 5.0 | 7.5 | 4.20 | 140 | 50 | .10 | 1.0 | 180 | 5300 | 1 | 1 | 112 |
| 15.0 | 5.0 | 5.0 | 4.40 | 120 | 70 | | | 230 | 5300 | 1 | 1 | 112 |
| 7.5 | 5.0 | 10.0 | 4.15 | 120 | 50 | | | 340 | 5300 | 1 | 1 | 112 |
| 7.5 | 10.0 | 10.0 | 4.10 | 100 | 10 | | | 510 | 5300 | 1 | 1 | 112 |
| 15.0 | 10.0 | 7.5 | 4.15 | 120 | 70 | .10 | 1.0 | 560 | 5300 | 1 | 1 | 113 |
| 15.0 | 10.0 | 10.0 | 4.10 | 120 | 70 | | | 660 | 5300 | 1 | 1 | 113 |
| 7.5 | 5.0 | 5.0 | 4.25 | 80 | 30 | | | 300 | 5300 | 1 | 1 | 121 |
| 7.5 | 5.0 | 5.0 | 4.25 | 80 | 30 | .40 | 1.0 | 390 | 5300 | 1 | 1 | 121 |
| 7.5 | 10.0 | 10.0 | 4.10 | 100 | 30 | .08 | 1.0 | 510 | 5300 | 1 | 1 | 121 |
| 7.5 | 10.0 | 10.0 | 3.90 | 120 | 30 | .15 | 2.5 | 500 | 5300 | 1 | 1 | 122 |
| 7.5 | 7.5 | 10.0 | 4.10 | 140 | 50 | | | 560 | 5300 | 1 | 1 | 123 |
| 15.0 | 10.0 | 10.0 | 4.10 | 120 | 50 | | | 660 | 5300 | 1 | 1 | 123 |
| 7.5 | 7.5 | 7.5 | 4.25 | 120 | 70 | .20 | 1.0 | 720 | 5300 | 1 | 1 | 133 |
| 7.5 | 10.0 | 10.0 | 3.90 | 140 | 50 | .45 | 1.0 | 450 | 5300 | 1 | 2 | 112 |
| 7.5 | 10.0 | 10.0 | 3.50 | 100 | 30 | .15 | 1.0 | 100 | 5400 | 1 | 1 | 111 |
| 7.5 | 10.0 | 10.0 | 3.70 | 120 | 30 | .08 | 5.0 | 100 | 5400 | 1 | 1 | 111 |
| 7.5 | 10.0 | 10.0 | 4.10 | 100 | 10 | .02 | 1.0 | 100 | 5400 | 1 | 1 | 111 |
| 7.5 | 10.0 | 10.0 | 3.50 | 140 | 70 | | | 130 | 5400 | 1 | 1 | 111 |
| 7.5 | 7.5 | 7.5 | 4.00 | 80 | 50 | .10 | 5.0 | 170 | 5400 | 1 | 1 | 111 |
| 7.5 | 10.0 | 10.0 | 3.50 | 100 | 50 | .30 | 1.0 | 170 | 5400 | 1 | 1 | 111 |
| 7.5 | 5.0 | 5.0 | 4.15 | 120 | 70 | | | 250 | 5400 | 1 | 1 | 111 |
| 7.5 | 5.0 | 5.0 | 4.25 | 100 | 30 | .40 | 1.0 | 290 | 5400 | 1 | 1 | 111 |
| 7.5 | 5.0 | 5.0 | 4.25 | 80 | 10 | | | 330 | 5400 | 1 | 1 | 111 |
| 7.5 | 7.5 | 7.5 | 4.00 | 80 | 10 | | | 340 | 5400 | 1 | 1 | 111 |
| 7.5 | 7.5 | 7.5 | 4.00 | 100 | 70 | .10 | 1.0 | 340 | 5400 | 1 | 1 | 111 |
| 7.5 | 10.0 | 10.0 | 3.90 | 100 | 70 | .18 | 1.0 | 370 | 5400 | 1 | 1 | 111 |
| 7.5 | 5.0 | 5.0 | 4.25 | 120 | 30 | .40 | 5.0 | 380 | 5400 | 1 | 1 | 111 |
| 7.5 | 5.0 | 10.0 | 4.15 | 120 | 30 | | | 380 | 5400 | 1 | 1 | 111 |
| 7.5 | 10.0 | 10.0 | 3.70 | 140 | 70 | .30 | 1.0 | 380 | 5400 | 1 | 1 | 111 |
| 7.5 | 7.5 | 7.5 | 4.25 | 80 | 50 | .40 | 1.0 | 400 | 5400 | 1 | 1 | 111 |
| 7.5 | 7.5 | 7.5 | 4.25 | 80 | 50 | .40 | 2.5 | 440 | 5400 | 1 | 1 | 111 |
| 7.5 | 7.5 | 7.5 | 4.25 | 80 | 70 | .20 | 2.5 | 450 | 5400 | 1 | 1 | 111 |
| 7.5 | 7.5 | 7.5 | 4.25 | 90 | 50 | .10 | 5.0 | 450 | 5400 | 1 | 1 | 111 |
| 7.5 | 7.5 | 7.5 | 4.25 | 90 | 20 | .40 | 1.0 | 490 | 5400 | 1 | 1 | 111 |
| 7.5 | 10.0 | 5.0 | 4.25 | 80 | 10 | .40 | 2.5 | 500 | 5400 | 1 | 1 | 111 |
| 15.0 | 10.0 | 15.0 | 4.10 | 120 | 70 | | | 540 | 5400 | 1 | 1 | 111 |
| 7.5 | 10.0 | 5.0 | 4.25 | 100 | 30 | .99 | 30.0 | 550 | 5400 | 1 | 1 | 111 |
| 7.5 | 7.5 | 7.5 | 4.25 | 80 | 20 | .40 | 2.5 | 580 | 5400 | 1 | 1 | 111 |
| 7.5 | 10.0 | 10.0 | 4.10 | 90 | 30 | .15 | 5.0 | 580 | 5400 | 1 | 1 | 111 |
| 7.5 | 10.0 | 10.0 | 3.70 | 100 | 50 | .15 | 1.0 | 310 | 5400 | 1 | 1 | 112 |
| 7.5 | 10.0 | 10.0 | 3.70 | 140 | 50 | | | 360 | 5400 | 1 | 1 | 112 |
| 15.0 | 5.0 | 5.0 | 4.40 | 120 | 70 | .17 | 1.0 | 360 | 5400 | 1 | 1 | 112 |
| 7.5 | 10.0 | 10.0 | 3.90 | 140 | 70 | .15 | 1.0 | 490 | 5400 | 1 | 1 | 112 |
| 7.5 | 10.0 | 10.0 | 4.10 | 120 | 30 | | | 510 | 5400 | 1 | 1 | 112 |
| 7.5 | 10.0 | 10.0 | 4.10 | 100 | 50 | .06 | 1.0 | 530 | 5400 | 1 | 1 | 121 |
| 7.5 | 7.5 | 7.5 | 4.25 | 120 | 20 | .40 | 2.5 | 530 | 5400 | 1 | 1 | 122 |
| 7.5 | 10.0 | 5.0 | 4.25 | 100 | 50 | .10 | 5.0 | 610 | 5400 | 1 | 1 | 122 |
| 7.5 | 7.5 | 7.5 | 4.25 | 120 | 10 | | | 430 | 5400 | 1 | 1 | 123 |
| 7.5 | 7.5 | 7.5 | 4.25 | 120 | 30 | .40 | 2.5 | 590 | 5400 | 1 | 1 | 123 |
| 7.5 | 7.5 | 10.0 | 3.90 | 120 | 30 | .10 | 1.0 | 120 | 5500 | 1 | 1 | 111 |
| 7.5 | 10.0 | 10.0 | 3.70 | 100 | 50 | .08 | 1.0 | 180 | 5500 | 1 | 1 | 111 |
| 7.5 | 7.5 | 7.5 | 4.25 | 140 | 30 | | | 200 | 5500 | 1 | 1 | 111 |
| 7.5 | 7.5 | 10.0 | 3.90 | 100 | 50 | .10 | 1.0 | 290 | 5500 | 1 | 1 | 111 |
| 7.5 | 5.0 | 5.0 | 4.25 | 100 | 50 | .10 | 1.0 | 300 | 5500 | 1 | 1 | 111 |
| 7.5 | 5.0 | 5.0 | 4.15 | 120 | 50 | | | 310 | 5500 | 1 | 1 | 111 |
| 7.5 | 7.5 | 7.5 | 4.00 | 120 | 70 | .40 | 2.5 | 320 | 5500 | 1 | 1 | 111 |
| 7.5 | 7.5 | 10.0 | 3.90 | 120 | 70 | | | 360 | 5500 | 1 | 1 | 111 |
| 7.5 | 10.0 | 10.0 | 3.70 | 100 | 30 | | | 370 | 5500 | 1 | 1 | 111 |
| 7.5 | 10.0 | 5.0 | 4.25 | 80 | 70 | .10 | 5.0 | 380 | 5500 | 1 | 1 | 111 |
| 7.5 | 7.5 | 7.5 | 4.25 | 80 | 70 | .30 | 1.0 | 400 | 5500 | 1 | 1 | 111 |
| 7.5 | 10.0 | 5.0 | 4.25 | 80 | 50 | .10 | 5.0 | 400 | 5500 | 1 | 1 | 111 |
| 7.5 | 7.5 | 7.5 | 4.25 | 90 | 50 | .10 | 2.5 | 410 | 5500 | 1 | 1 | 111 |
| 7.5 | 7.5 | 10.0 | 3.90 | 120 | 50 | | | 410 | 5500 | 1 | 1 | 111 |
| 7.5 | 10.0 | 10.0 | 4.10 | 90 | 70 | .18 | 5.0 | 410 | 5500 | 1 | 1 | 111 |
| 7.5 | 7.5 | 7.5 | 4.25 | 80 | 50 | | | 430 | 5500 | 1 | 1 | 111 |
| 7.5 | 7.5 | 10.0 | 3.90 | 100 | 30 | | | 440 | 5500 | 1 | 1 | 111 |
| 7.5 | 10.0 | 5.0 | 4.25 | 80 | 10 | .20 | 1.0 | 480 | 5500 | 1 | 1 | 111 |
| 15.0 | 10.0 | 10.0 | 4.15 | 120 | 70 | | | 530 | 5500 | 1 | 1 | 111 |
| 7.5 | 10.0 | 10.0 | 4.10 | 100 | 30 | .15 | 1.0 | 550 | 5500 | 1 | 1 | 111 |
| 7.5 | 10.0 | 10.0 | 4.15 | 120 | 90 | .10 | 1.0 | 620 | 5500 | 1 | 1 | 111 |
| 7.5 | 7.5 | 10.0 | 3.90 | 120 | 30 | | | 120 | 5500 | 1 | 1 | 112 |

APPENDIX-continued

TABLE 1

| TKNS | ELECTROLYTE | | | CURRENT | | | | HYSTER. PROP. | | LOOP ANALYSIS | | |
|---|---|---|---|---|---|---|---|---|---|---|---|---|
| | CO | ADD. | PH | T | CD | P | PD | HC | BY. | A | P | L |
| 15.0 | 5.0 | 5.0 | 4.40 | 120 | 50 | | | 300 | 5500 | 1 | 1 | 112 |
| 15.0 | 5.0 | 5.0 | 4.40 | 120 | 30 | .15 | 1.0 | 380 | 5500 | 1 | 1 | 112 |
| 7.5 | 10.0 | 10.0 | 3.90 | 140 | 70 | .15 | 1.0 | 510 | 5500 | 1 | 1 | 112 |
| 15.0 | 10.0 | 10.0 | 4.10 | 120 | 50 | .15 | 1.0 | 560 | 5500 | 1 | 1 | 112 |
| 7.5 | 5.0 | 5.0 | 4.25 | 80 | 50 | | | 200 | 5500 | 1 | 1 | 121 |
| 7.5 | 7.5 | 7.5 | 4.25 | 90 | 70 | .20 | 5.0 | 420 | 5500 | 1 | 1 | 121 |
| 7.5 | 7.5 | 10.0 | 4.10 | 100 | 10 | | | 390 | 5500 | 1 | 1 | 122 |
| 7.5 | 7.5 | 7.5 | 4.25 | 100 | 10 | .40 | 1.0 | 560 | 5500 | 1 | 1 | 122 |
| 7.5 | 10.0 | 10.0 | 4.10 | 100 | 30 | .15 | 5.0 | 610 | 5500 | 1 | 1 | 122 |
| 7.5 | 10.0 | 10.0 | 4.10 | 120 | 50 | .06 | 1.0 | 620 | 5500 | 1 | 1 | 122 |
| 7.5 | 7.5 | 7.5 | 4.00 | 140 | 50 | .10 | 1.0 | 210 | 5500 | 1 | 1 | 123 |
| 7.5 | 7.5 | 7.5 | 4.25 | 120 | 50 | .40 | 1.0 | 680 | 5500 | 1 | 1 | 123 |
| 7.5 | 7.5 | 7.5 | 4.25 | 120 | 70 | .30 | 5.0 | 770 | 5500 | 1 | 1 | 133 |
| 7.5 | 10.0 | 10.0 | 3.50 | 140 | 50 | .15 | 1.0 | 90 | 5600 | 1 | 1 | 111 |
| 7.5 | 10.0 | 10.0 | 3.50 | 140 | 70 | .18 | 1.0 | 100 | 5600 | 1 | 1 | 111 |
| 7.5 | 10.0 | 10.0 | 3.90 | 120 | 10 | .16 | 1.0 | 100 | 5600 | 1 | 1 | 111 |
| 7.5 | 10.0 | 10.0 | 3.50 | 100 | 30 | .30 | 1.0 | 120 | 5600 | 1 | 1 | 111 |
| 7.5 | 5.0 | 10.0 | 4.20 | 120 | 70 | .10 | 1.0 | 190 | 5600 | 1 | 1 | 111 |
| 7.5 | 7.5 | 7.5 | 4.00 | 120 | 30 | | | 200 | 5600 | 1 | 1 | 111 |
| 7.5 | 5.0 | 7.5 | 4.15 | 120 | 30 | | | 330 | 5600 | 1 | 1 | 111 |
| 7.5 | 7.5 | 10.0 | 3.90 | 120 | 30 | | | 330 | 5600 | 1 | 1 | 111 |
| 7.5 | 10.0 | 10.0 | 3.70 | 120 | 70 | .18 | 5.0 | 340 | 5600 | 1 | 1 | 111 |
| 7.5 | 5.0 | 5.0 | 4.25 | 120 | 50 | .40 | 1.0 | 350 | 5600 | 1 | 1 | 111 |
| 7.5 | 7.5 | 7.5 | 4.25 | 80 | 70 | .20 | 1.0 | 380 | 5600 | 1 | 1 | 111 |
| 7.5 | 10.0 | 10.0 | 3.90 | 100 | 50 | .10 | 1.0 | 380 | 5600 | 1 | 1 | 111 |
| 7.5 | 10.0 | 10.0 | 4.10 | 90 | 70 | .18 | 2.5 | 390 | 5600 | 1 | 1 | 111 |
| 7.5 | 10.0 | 10.0 | 3.90 | 100 | 50 | .23 | 1.0 | 400 | 5600 | 1 | 1 | 111 |
| 7.5 | 10.0 | 5.0 | 4.25 | 80 | 30 | .10 | 1.0 | 410 | 5600 | 1 | 1 | 111 |
| 7.5 | 10.0 | 10.0 | 4.10 | 90 | 50 | .30 | 1.0 | 410 | 5600 | 1 | 1 | 111 |
| 7.5 | 10.0 | 10.0 | 3.90 | 140 | 50 | | | 430 | 5600 | 1 | 1 | 111 |
| 7.5 | 10.0 | 10.0 | 4.10 | 90 | 50 | .30 | 2.5 | 430 | 5600 | 1 | 1 | 111 |
| 7.5 | 10.0 | 10.0 | 4.10 | 90 | 50 | .30 | 5.0 | 430 | 5600 | 1 | 1 | 111 |
| 7.5 | 10.0 | 10.0 | 3.90 | 120 | 30 | | | 440 | 5600 | 1 | 1 | 111 |
| 7.5 | 10.0 | 10.0 | 3.90 | 120 | 30 | .15 | 1.0 | 440 | 5600 | 1 | 1 | 111 |
| 7.5 | 10.0 | 10.0 | 4.10 | 90 | 70 | .18 | 1.0 | 440 | 5600 | 1 | 1 | 111 |
| 7.5 | 10.0 | 10.0 | 3.90 | 120 | 30 | .30 | 1.0 | 450 | 5600 | 1 | 1 | 111 |
| 7.5 | 10.0 | 10.0 | 4.10 | 90 | 70 | .30 | 10.0 | 450 | 5600 | 1 | 1 | 111 |
| 7.5 | 10.0 | 10.0 | 4.10 | 90 | 50 | .15 | 1.0 | 470 | 5600 | 1 | 1 | 111 |
| 7.5 | 10.0 | 10.0 | 4.10 | 100 | 70 | .09 | 1.0 | 470 | 5600 | 1 | 1 | 111 |
| 7.5 | 10.0 | 10.0 | 3.90 | 120 | 50 | .08 | 1.0 | 510 | 5600 | 1 | 1 | 111 |
| 7.5 | 10.0 | 10.0 | 4.10 | 100 | 50 | .15 | 2.5 | 530 | 5600 | 1 | 1 | 111 |
| 7.5 | 10.0 | 10.0 | 4.10 | 90 | 10 | | | 548 | 5600 | 1 | 1 | 111 |
| 7.5 | 5.0 | 5.0 | 4.15 | 120 | 30 | | | 250 | 5600 | 1 | 1 | 112 |
| 15.0 | 5.0 | 5.0 | 4.40 | 120 | 50 | .15 | 1.0 | 360 | 5600 | 1 | 1 | 112 |
| 15.0 | 10.0 | 7.5 | 4.15 | 120 | 70 | | | 500 | 5600 | 1 | 1 | 112 |
| 15.0 | 10.0 | 10.0 | 4.10 | 120 | 50 | .30 | 1.0 | 530 | 5600 | 1 | 1 | 112 |
| 15.0 | 10.0 | 10.0 | 4.10 | 120 | 50 | .60 | 1.0 | 530 | 5600 | 1 | 1 | 112 |
| 7.5 | 7.5 | 7.5 | 4.25 | 90 | 10 | | | 520 | 5600 | 1 | 1 | 121 |
| 7.5 | 10.0 | 10.0 | 4.10 | 100 | 50 | .08 | 2.5 | 600 | 5600 | 1 | 1 | 121 |
| 7.5 | 10.0 | 10.0 | 4.10 | 90 | 10 | .04 | 1.0 | 260 | 5600 | 1 | 1 | 122 |
| 7.5 | 7.5 | 10.0 | 4.10 | 120 | 50 | .20 | 5.0 | 680 | 5600 | 1 | 1 | 122 |
| 7.5 | 10.0 | 10.0 | 3.50 | 120 | 30 | .15 | 1.0 | 90 | 5700 | 1 | 1 | 111 |
| 7.5 | 10.0 | 10.0 | 3.70 | 100 | 10 | .08 | 1.0 | 100 | 5700 | 1 | 1 | 111 |
| 7.5 | 10.0 | 10.0 | 3.50 | 140 | 50 | | | 120 | 5700 | 1 | 1 | 111 |
| 7.5 | 7.5 | 7.5 | 4.00 | 100 | 30 | .40 | 5.0 | 150 | 5700 | 1 | 1 | 111 |
| 7.5 | 10.0 | 10.0 | 3.70 | 100 | 30 | .15 | 1.0 | 160 | 5700 | 1 | 1 | 111 |
| 7.5 | 7.5 | 10.0 | 4.10 | 100 | 10 | .40 | 1.0 | 250 | 5700 | 1 | 1 | 111 |
| 7.5 | 7.5 | 7.5 | 4.25 | 80 | 70 | .30 | 5.0 | 320 | 5700 | 1 | 1 | 111 |
| 7.5 | 10.0 | 10.0 | 3.90 | 100 | 70 | | | 360 | 5700 | 1 | 1 | 111 |
| 7.5 | 10.0 | 10.0 | 3.90 | 100 | 70 | .30 | 1.0 | 370 | 5700 | 1 | 1 | 111 |
| 7.5 | 5.0 | 5.0 | 4.25 | 120 | 50 | .10 | 1.0 | 380 | 5700 | 1 | 1 | 111 |
| 7.5 | 7.5 | 7.5 | 4.25 | 80 | 50 | .20 | 2.5 | 410 | 5700 | 1 | 1 | 111 |
| 7.5 | 7.5 | 7.5 | 4.25 | 90 | 70 | .10 | 1.0 | 410 | 5700 | 1 | 1 | 111 |
| 7.5 | 5.0 | 5.0 | 4.25 | 120 | 70 | .10 | 5.0 | 450 | 5700 | 1 | 1 | 111 |
| 7.5 | 10.0 | 10.0 | 3.90 | 140 | 70 | .30 | 1.0 | 450 | 5700 | 1 | 1 | 111 |
| 7.5 | 10.0 | 10.0 | 4.10 | 100 | 50 | .12 | 1.0 | 450 | 5700 | 1 | 1 | 111 |
| 7.5 | 10.0 | 12.5 | 4.15 | 100 | 90 | .40 | 5.0 | 450 | 5700 | 1 | 1 | 111 |
| 15.0 | 10.0 | 10.0 | 4.10 | 120 | 70 | .60 | 1.0 | 450 | 5700 | 1 | 1 | 111 |
| 7.5 | 7.5 | 7.5 | 4.25 | 100 | 10 | .40 | 2.5 | 460 | 5700 | 1 | 1 | 111 |
| 7.5 | 10.0 | 5.0 | 4.25 | 80 | 10 | .40 | 1.0 | 500 | 5700 | 1 | 1 | 111 |
| 7.5 | 10.0 | 12.5 | 4.15 | 120 | 90 | .10 | 1.0 | 650 | 5700 | 1 | 1 | 111 |
| 15.0 | 5.0 | 5.0 | 4.40 | 120 | 30 | | | 350 | 5700 | 1 | 1 | 112 |
| 15.0 | 10.0 | 10.0 | 4.10 | 120 | 30 | | | 490 | 5700 | 1 | 1 | 112 |
| 7.5 | 10.0 | 10.0 | 4.10 | 120 | 50 | .12 | 1.0 | 550 | 5700 | 1 | 1 | 112 |
| 7.5 | 7.5 | 7.5 | 4.25 | 90 | 20 | .20 | 1.0 | 451 | 5700 | 1 | 1 | 113 |
| 7.5 | 7.5 | 10.0 | 4.10 | 100 | 10 | .40 | 5.0 | 200 | 5700 | 1 | 1 | 121 |
| 7.5 | 7.5 | 7.5 | 4.25 | 90 | 50 | .20 | 1.0 | 360 | 5700 | 1 | 1 | 122 |
| 7.5 | 7.5 | 7.5 | 4.25 | 120 | 10 | .10 | 1.0 | 390 | 5700 | 1 | 1 | 122 |
| 7.5 | 10.0 | 10.0 | 3.90 | 120 | 30 | .15 | 1.0 | 480 | 5700 | 1 | 1 | 122 |
| 7.5 | 10.0 | 10.0 | 4.10 | 100 | 30 | .15 | 2.5 | 610 | 5700 | 1 | 1 | 122 |
| 7.5 | 10.0 | 10.0 | 3.90 | 100 | 50 | .06 | 1.0 | 340 | 5700 | 1 | 1 | 123 |
| 7.5 | 7.5 | 7.5 | 4.25 | 120 | 70 | .30 | 2.0 | 730 | 5700 | 1 | 1 | 123 |
| 7.5 | 7.5 | 7.5 | 4.25 | 120 | 50 | .10 | 1.0 | 710 | 5700 | 1 | 1 | 133 |
| 7.5 | 10.0 | 10.0 | 3.90 | 100 | 10 | .04 | 1.0 | 95 | 5800 | 1 | 1 | 111 |
| 7.5 | 10.0 | 10.0 | 3.70 | 120 | 30 | | | 190 | 5800 | 1 | 1 | 111 |
| 7.5 | 10.0 | 10.0 | 3.70 | 120 | 70 | .09 | 2.5 | 250 | 5800 | 1 | 1 | 111 |

APPENDIX-continued

TABLE 1

| TKNS | ELECTROLYTE | | | CURRENT | | | | HYSTER. PROP. | | LOOP ANALYSIS | | |
|---|---|---|---|---|---|---|---|---|---|---|---|---|
| | CO | ADD. | PH | T | CD | P | PD | HC | BY | A | P | L |
| 7.5 | 7.5 | 7.5 | 4.00 | 120 | 50 | .40 | 5.0 | 360 | 5800 | 1 | 1 | 111 |
| 7.5 | 10.0 | 10.0 | 3.70 | 120 | 70 | .18 | 1.0 | 370 | 5800 | 1 | 1 | 111 |
| 7.5 | 10.0 | 10.0 | 3.70 | 120 | 70 | | | 380 | 5800 | 1 | 1 | 111 |
| 7.5 | 10.0 | 10.0 | 4.10 | 90 | 70 | | | 380 | 5800 | 1 | 1 | 111 |
| 7.5 | 10.0 | 10.0 | 4.10 | 90 | 70 | .30 | 1.0 | 380 | 5800 | 1 | 1 | 111 |
| 7.5 | 10.0 | 10.0 | 4.10 | 100 | 70 | | | 410 | 5800 | 1 | 1 | 111 |
| 7.5 | 10.0 | 10.0 | 4.10 | 90 | 50 | | | 430 | 5800 | 1 | 1 | 111 |
| 7.5 | 10.0 | 10.0 | 4.10 | 100 | 70 | .08 | 1.0 | 430 | 5800 | 1 | 1 | 111 |
| 7.5 | 7.5 | 7.5 | 4.25 | 90 | 50 | .20 | 5.0 | 440 | 5800 | 1 | 1 | 111 |
| 7.5 | 10.0 | 12.5 | 4.15 | 100 | 90 | .10 | 1.0 | 450 | 5800 | 1 | 1 | 111 |
| 7.5 | 10.0 | 10.0 | 3.90 | 120 | 50 | .12 | 1.0 | 460 | 5800 | 1 | 1 | 111 |
| 7.5 | 10.0 | 10.0 | 3.90 | 120 | 50 | .23 | 1.0 | 460 | 5800 | 1 | 1 | 111 |
| 7.5 | 10.0 | 10.0 | 4.10 | 100 | 50 | | | 480 | 5800 | 1 | 1 | 111 |
| 7.5 | 10.0 | 5.0 | 4.25 | 120 | 30 | | | 490 | 5800 | 1 | 1 | 111 |
| 7.5 | 10.0 | 10.0 | 3.90 | 120 | 70 | .09 | 1.0 | 490 | 5800 | 1 | 1 | 111 |
| 7.5 | 10.0 | 5.0 | 4.25 | 100 | 30 | .40 | 5.0 | 530 | 5800 | 1 | 1 | 111 |
| 7.5 | 10.0 | 10.0 | 4.15 | 120 | 90 | .40 | 5.0 | 560 | 5800 | 1 | 1 | 111 |
| 7.5 | 10.0 | 10.0 | 3.50 | 120 | 70 | | | 230 | 5800 | 1 | 1 | 121 |
| 7.5 | 7.5 | 7.5 | 4.25 | 90 | 10 | .20 | 1.0 | 410 | 5800 | 1 | 1 | 122 |
| 7.5 | 7.5 | 7.5 | 4.25 | 120 | 20 | .40 | 1.0 | 500 | 5800 | 1 | 1 | 122 |
| 7.5 | 10.0 | 5.0 | 4.25 | 120 | 30 | .40 | 1.0 | 510 | 5800 | 1 | 1 | 122 |
| 7.5 | 10.0 | 5.0 | 4.25 | 120 | 50 | .10 | 1.0 | 510 | 5800 | 1 | 1 | 122 |
| 7.5 | 10.0 | 5.0 | 4.25 | 100 | 70 | .40 | 1.0 | 530 | 5800 | 1 | 1 | 122 |
| 7.5 | 7.5 | 7.5 | 4.25 | 120 | 30 | | | 550 | 5800 | 1 | 1 | 122 |
| 7.5 | 10.0 | 10.0 | 4.10 | 100 | 30 | .15 | 1.0 | 560 | 5800 | 1 | 1 | 122 |
| 7.5 | 7.5 | 7.5 | 4.25 | 120 | 70 | .30 | 1.0 | 710 | 5800 | 1 | 1 | 123 |
| 7.5 | 10.0 | 10.0 | 3.50 | 120 | 30 | .30 | 1.0 | 90 | 5900 | 1 | 1 | 111 |
| 7.5 | 10.0 | 10.0 | 3.50 | 120 | 50 | .09 | 1.0 | 100 | 5900 | 1 | 1 | 111 |
| 7.5 | 5.0 | 5.0 | 4.25 | 120 | 50 | | | 300 | 5900 | 1 | 1 | 111 |
| 7.5 | 10.0 | 10.0 | 3.70 | 120 | 70 | .18 | 2.5 | 360 | 5900 | 1 | 1 | 111 |
| 7.5 | 7.5 | 7.5 | 4.25 | 90 | 70 | .20 | 1.0 | 380 | 5900 | 1 | 1 | 111 |
| 7.5 | 10.0 | 5.0 | 4.25 | 80 | 50 | .10 | 1.0 | 380 | 5900 | 1 | 1 | 111 |
| 7.5 | 5.0 | 5.0 | 4.40 | 120 | 50 | .06 | 1.0 | 410 | 5900 | 1 | 1 | 111 |
| 7.5 | 10.0 | 10.0 | 3.90 | 100 | 30 | | | 410 | 5900 | 1 | 1 | 111 |
| 7.5 | 10.0 | 10.0 | 4.10 | 90 | 70 | .30 | 5.0 | 430 | 5900 | 1 | 1 | 111 |
| 7.5 | 10.0 | 5.0 | 4.25 | 80 | 10 | | | 450 | 5900 | 1 | 1 | 111 |
| 7.5 | 10.0 | 10.0 | 4.10 | 90 | 70 | .30 | 2.5 | 450 | 5900 | 1 | 1 | 111 |
| 7.5 | 10.0 | 5.0 | 4.25 | 80 | 10 | .40 | 1.0 | 460 | 5900 | 1 | 1 | 111 |
| 7.5 | 10.0 | 10.0 | 3.90 | 120 | 50 | .11 | 1.0 | 470 | 5900 | 1 | 1 | 111 |
| 7.5 | 10.0 | 10.0 | 4.10 | 100 | 50 | .23 | 1.0 | 470 | 5900 | 1 | 1 | 111 |
| 7.5 | 10.0 | 10.0 | 4.10 | 90 | 30 | | | 480 | 5900 | 1 | 1 | 111 |
| 7.5 | 10.0 | 10.0 | 4.10 | 100 | 30 | | | 530 | 5900 | 1 | 1 | 111 |
| 7.5 | 10.0 | 10.0 | 4.10 | 120 | 30 | | | 550 | 5900 | 1 | 1 | 112 |
| 7.5 | 7.5 | 7.5 | 4.25 | 120 | 30 | .40 | 1.0 | 580 | 5900 | 1 | 1 | 122 |
| 7.5 | 10.0 | 5.0 | 4.25 | 120 | 50 | .40 | 5.0 | 580 | 5900 | 1 | 1 | 122 |
| 7.5 | 7.5 | 7.5 | 4.25 | 120 | 70 | | | 700 | 5900 | 1 | 1 | 122 |
| 7.5 | 7.5 | 7.5 | 4.25 | 120 | 50 | | | 690 | 5900 | 1 | 1 | 123 |
| 7.5 | 10.0 | 10.0 | 3.50 | 120 | 30 | | | 90 | 6000 | 1 | 1 | 111 |
| 7.5 | 10.0 | 10.0 | 3.70 | 120 | 30 | .08 | 2.5 | 100 | 6000 | 1 | 1 | 111 |
| 7.5 | 10.0 | 10.0 | 3.50 | 100 | 30 | | | 110 | 6000 | 1 | 1 | 111 |
| 7.5 | 10.0 | 10.0 | 3.70 | 100 | 10 | .15 | 1.0 | 110 | 6000 | 1 | 1 | 111 |
| 7.5 | 10.0 | 10.0 | 3.70 | 120 | 30 | .15 | 1.0 | 130 | 6000 | 1 | 1 | 111 |
| 7.5 | 10.0 | 10.0 | 3.70 | 120 | 50 | .08 | 5.0 | 140 | 6000 | 1 | 1 | 111 |
| 7.5 | 10.0 | 10.0 | 3.70 | 120 | 70 | .09 | 1.0 | 220 | 6000 | 1 | 1 | 111 |
| 7.5 | 7.5 | 7.5 | 4.00 | 140 | 70 | .10 | 1.0 | 260 | 6000 | 1 | 1 | 111 |
| 7.5 | 7.5 | 7.5 | 4.00 | 120 | 70 | .30 | 5.0 | 280 | 6000 | 1 | 1 | 111 |
| 7.5 | 7.5 | 7.5 | 4.00 | 120 | 70 | .10 | 1.0 | 300 | 6000 | 1 | 1 | 111 |
| 7.5 | 5.0 | 5.0 | 4.25 | 120 | 70 | .40 | 5.0 | 322 | 6000 | 1 | 1 | 111 |
| 7.5 | 10.0 | 10.0 | 3.70 | 140 | 70 | | | 350 | 6000 | 1 | 1 | 111 |
| 7.5 | 5.0 | 5.0 | 4.25 | 120 | 70 | .10 | 1.0 | 380 | 6000 | 1 | 1 | 111 |
| 7.5 | 7.5 | 7.5 | 4.25 | 90 | 70 | .20 | 2.5 | 400 | 6000 | 1 | 1 | 111 |
| 7.5 | 10.0 | 5.0 | 4.25 | 80 | 30 | .40 | 5.0 | 410 | 6000 | 1 | 1 | 111 |
| 7.5 | 7.5 | 7.5 | 4.25 | 90 | 50 | .20 | 2.5 | 430 | 6000 | 1 | 1 | 111 |
| 7.5 | 10.0 | 10.0 | 3.90 | 140 | 70 | | | 430 | 6000 | 1 | 1 | 111 |
| 7.5 | 10.0 | 10.0 | 4.10 | 100 | 70 | .30 | 1.0 | 430 | 6000 | 1 | 1 | 111 |
| 7.5 | 10.0 | 5.0 | 4.25 | 100 | 30 | .10 | 5.0 | 500 | 6000 | 1 | 1 | 111 |
| 7.5 | 10.0 | 10.0 | 3.90 | 120 | 50 | .15 | 2.5 | 510 | 6000 | 1 | 1 | 111 |
| 7.5 | 10.0 | 10.0 | 4.10 | 100 | 50 | .08 | 1.0 | 510 | 6000 | 1 | 1 | 111 |
| 7.5 | 10.0 | 10.0 | 4.10 | 90 | 30 | .15 | 2.5 | 560 | 6000 | 1 | 1 | 111 |
| 7.5 | 10.0 | 12.5 | 4.15 | 120 | 90 | .40 | 5.0 | 560 | 6000 | 1 | 1 | 111 |
| 7.5 | 5.0 | 5.0 | 4.25 | 120 | 30 | | | 320 | 6000 | 1 | 1 | 121 |
| 10.0 | 7.5 | 10.0 | 4.10 | 120 | 50 | .10 | 1.0 | 640 | 6000 | 1 | 1 | 121 |
| 7.5 | 10.0 | 10.0 | 3.90 | 100 | 30 | .15 | 1.0 | 370 | 6000 | 1 | 1 | 123 |
| 7.5 | 10.0 | 10.0 | 3.50 | 120 | 50 | | | 110 | 6100 | 1 | 1 | 111 |
| 7.5 | 10.0 | 10.0 | 3.70 | 120 | 30 | .15 | 2.5 | 120 | 6100 | 1 | 1 | 111 |
| 7.5 | 10.0 | 10.0 | 3.70 | 120 | 30 | .15 | 5.0 | 120 | 6100 | 1 | 1 | 111 |
| 7.5 | 10.0 | 10.0 | 3.70 | 120 | 50 | .08 | 2.5 | 140 | 6100 | 1 | 1 | 111 |
| 7.5 | 5.0 | 7.5 | 4.20 | 100 | 30 | | | 230 | 6100 | 1 | 1 | 111 |
| 7.5 | 7.5 | 7.5 | 4.00 | 120 | 50 | | | 230 | 6100 | 1 | 1 | 111 |
| 7.5 | 7.5 | 7.5 | 4.00 | 140 | 70 | .20 | 5.0 | 260 | 6100 | 1 | 1 | 111 |
| 7.5 | 7.5 | 7.5 | 4.25 | 90 | 70 | | | 300 | 6100 | 1 | 1 | 111 |
| 7.5 | 7.5 | 7.5 | 4.00 | 100 | 30 | | | 320 | 6100 | 1 | 1 | 111 |
| 7.5 | 10.0 | 5.0 | 4.25 | 80 | 70 | .40 | 1.0 | 340 | 6100 | 1 | 1 | 111 |
| 7.5 | 10.0 | 5.0 | 4.25 | 80 | 70 | .40 | 5.0 | 350 | 6100 | 1 | 1 | 111 |
| 7.5 | 7.5 | 7.5 | 4.25 | 90 | 50 | | | 380 | 6100 | 1 | 1 | 111 |
| 7.5 | 10.0 | 5.0 | 4.25 | 80 | 30 | .10 | 4.0 | 380 | 6100 | 1 | 1 | 111 |

APPENDIX-continued

TABLE I

| TKNS | ELECTROLYTE | | | CURRENT | | | | HYSTER. PROP. | | LOOP ANALYSIS | | |
|---|---|---|---|---|---|---|---|---|---|---|---|---|
| | CO | ADD. | PH | T | CD | P | PD | HC | BY | A | P | L |
| 7.5 | 7.5 | 7.5 | 4.25 | 90 | 50 | .10 | 1.0 | 410 | 6100 | 1 | 1 | 111 |
| 7.5 | 7.5 | 7.5 | 4.25 | 90 | 50 | .40 | 2.5 | 410 | 6100 | 1 | 1 | 111 |
| 7.5 | 10.0 | 10.0 | 3.90 | 100 | 50 | | | 410 | 6100 | 1 | 1 | 111 |
| 7.5 | 10.0 | 5.0 | 4.25 | 100 | 30 | | | 430 | 6100 | 1 | 1 | 111 |
| 7.5 | 10.0 | 10.0 | 3.70 | 120 | 50 | | | 430 | 6100 | 1 | 1 | 111 |
| 7.5 | 7.5 | 7.5 | 90 | 50 | .40 | 5.0 | 440 | 6100 | 1 | 1 | 111 | |
| | | 4.25 | | | | | | | | | | |
| 7.5 | 10.0 | 10.0 | 3.90 | 120 | 50 | .15 | 1.0 | 460 | 6100 | 1 | 1 | 111 |
| 7.5 | 10.0 | 10.0 | 3.90 | 120 | 50 | .45 | 1.0 | 470 | 6100 | 1 | 1 | 111 |
| 7.5 | 7.5 | 10.0 | 4.10 | 100 | 70 | .20 | 5.0 | 480 | 6100 | 1 | 1 | 111 |
| 7.5 | 7.5 | 10.0 | 4.10 | 120 | 30 | | | 480 | 6100 | 1 | 1 | 111 |
| 7.5 | 5.0 | 5.0 | 4.25 | 120 | 70 | | | 500 | 6100 | 1 | 1 | 111 |
| 7.5 | 7.5 | 7.5 | 4.25 | 100 | 20 | | | 530 | 6100 | 1 | 1 | 111 |
| 15.0 | 10.0 | 10.0 | 4.10 | 120 | 70 | .30 | 1.0 | 540 | 6100 | 1 | 1 | 111 |
| 7.5 | 10.0 | 10.0 | 4.10 | 120 | 70 | .09 | 1.0 | 580 | 6100 | 1 | 1 | 111 |
| 7.5 | 5.0 | 7.5 | 4.20 | 140 | 70 | .10 | 1.0 | 210 | 6100 | 1 | 1 | 112 |
| 7.5 | 10.0 | 10.0 | 3.70 | 120 | 50 | .15 | 5.0 | 230 | 6100 | 1 | 1 | 112 |
| 7.5 | 10.0 | 10.0 | 3.70 | 100 | 10 | | | 110 | 6200 | 1 | 1 | 111 |
| 7.5 | 10.0 | 10.0 | 3.70 | 120 | 30 | .08 | 1.0 | 110 | 6200 | 1 | 1 | 111 |
| 7.5 | 7.5 | 7.5 | 4.00 | 140 | 70 | | | 210 | 6200 | 1 | 1 | 111 |
| 7.5 | 7.5 | 7.5 | 4.00 | 120 | 70 | | | 230 | 6200 | 1 | 1 | 111 |
| 7.5 | 7.5 | 7.5 | 4.00 | 140 | 50 | .20 | 5.0 | 250 | 6200 | 1 | 1 | 111 |
| 7.5 | 10.0 | 10.0 | 3.70 | 120 | 50 | .30 | 2.5 | 270 | 6200 | 1 | 1 | 111 |
| 7.5 | 10.0 | 5.0 | 4.25 | 80 | 70 | | | 290 | 6200 | 1 | 1 | 111 |
| 7.5 | 5.0 | 5.0 | 4.25 | 120 | 70 | .40 | 1.0 | 300 | 6200 | 1 | 1 | 111 |
| 7.5 | 10.0 | 5.0 | 4.25 | 80 | 50 | .40 | 5.0 | 380 | 6200 | 1 | 1 | 111 |
| 7.5 | 7.5 | 7.5 | 4.25 | 90 | 50 | .40 | 1.0 | 400 | 6200 | 1 | 1 | 111 |
| 7.5 | 10.0 | 10.0 | 3.90 | 120 | 70 | .15 | 1.0 | 430 | 6200 | 1 | 1 | 111 |
| 7.5 | 10.0 | 5.0 | 4.25 | 100 | 10 | | | 480 | 6200 | 1 | 1 | 111 |
| 10.0 | 7.5 | 10.0 | 4.10 | 100 | 70 | .10 | 1.0 | 490 | 6200 | 1 | 1 | 111 |
| 7.5 | 7.5 | 7.5 | 4.25 | 90 | 20 | | | 500 | 6200 | 1 | 1 | 111 |
| 7.5 | 10.0 | 5.0 | 4.25 | 100 | 30 | .10 | 1.0 | 510 | 6200 | 1 | 1 | 111 |
| 7.5 | 10.0 | 10.0 | 4.10 | 120 | 50 | .23 | 1.0 | 530 | 6200 | 1 | 1 | 111 |
| 7.5 | 10.0 | 10.0 | 4.10 | 120 | 70 | .17 | 1.0 | 530 | 6200 | 1 | 1 | 111 |
| 7.5 | 7.5 | 10.0 | 4.10 | 100 | 50 | .10 | 1.0 | 550 | 6200 | 1 | 1 | 111 |
| 7.5 | 7.5 | 10.0 | 4.10 | 100 | 50 | .20 | 2.5 | 550 | 6200 | 1 | 1 | 111 |
| 7.5 | 10.0 | 10.0 | 3.90 | 100 | 10 | .08 | 1.0 | 110 | 6300 | 1 | 1 | 111 |
| 7.5 | 10.0 | 10.0 | 3.90 | 100 | 10 | .15 | 1.0 | 120 | 6300 | 1 | 1 | 111 |
| 7.5 | 7.5 | 7.5 | 4.00 | 100 | 30 | .10 | 1.0 | 140 | 6300 | 1 | 1 | 111 |
| 7.5 | 10.0 | 10.0 | 3.70 | 120 | 50 | .08 | 1.0 | 140 | 6300 | 1 | 1 | 111 |
| 7.5 | 10.0 | 10.0 | 3.90 | 120 | 50 | | | 420 | 6300 | 1 | 1 | 111 |
| 7.5 | 10.0 | 5.0 | 4.25 | 100 | 50 | | | 460 | 6300 | 1 | 1 | 111 |
| 7.5 | 10.0 | 10.0 | 4.10 | 100 | 50 | | | 490 | 6300 | 1 | 1 | 111 |
| 7.5 | 7.5 | 10.0 | 4.10 | 120 | 70 | .10 | 1.0 | 600 | 6300 | 1 | 1 | 111 |
| 7.5 | 7.5 | 10.0 | 4.10 | 120 | 70 | .20 | 5.0 | 640 | 6300 | 1 | 1 | 111 |
| 7.5 | 10.0 | 5.0 | 4.25 | 120 | 50 | .40 | 1.0 | 530 | 6300 | 1 | 1 | 112 |
| 7.5 | 10.0 | 10.0 | 3.50 | 120 | 50 | .18 | 1.0 | 100 | 6400 | 1 | 1 | 111 |
| 7.5 | 10.0 | 10.0 | 3.50 | 120 | 50 | .35 | 1.0 | 110 | 6400 | 1 | 1 | 111 |
| 7.5 | 10.0 | 10.0 | 3.50 | 120 | 70 | .09 | 1.0 | 110 | 6400 | 1 | 1 | 111 |
| 7.5 | 10.0 | 10.0 | 3.50 | 120 | 70 | .18 | 1.0 | 120 | 6400 | 1 | 1 | 111 |
| 7.5 | 10.0 | 10.0 | 3.70 | 120 | 50 | .30 | 1.0 | 270 | 6400 | 1 | 1 | 111 |
| 7.5 | 7.5 | 10.0 | 4.10 | 100 | 70 | | | 380 | 6400 | 1 | 1 | 111 |
| 7.5 | 10.0 | 5.0 | 4.25 | 80 | 30 | | | 420 | 6400 | 1 | 1 | 111 |
| 7.5 | 10.0 | 10.0 | 4.10 | 100 | 30 | | | 530 | 6400 | 1 | 1 | 111 |
| 7.5 | 10.0 | 10.0 | 3.70 | 120 | 50 | .30 | 5.0 | 340 | 6400 | 1 | 1 | 112 |
| 7.5 | 10.0 | 5.0 | 4.25 | 80 | 70 | .10 | 1.0 | 350 | 6400 | 1 | 1 | 112 |
| 7.5 | 10.0 | 10.0 | 3.90 | 100 | 10 | | | 120 | 6500 | 1 | 1 | 111 |
| 7.5 | 10.0 | 10.0 | 3.70 | 120 | 30 | .30 | 1.0 | 140 | 6500 | 1 | 1 | 111 |
| 7.5 | 10.0 | 10.0 | 3.70 | 120 | 30 | .30 | 2.5 | 140 | 6500 | 1 | 1 | 111 |
| 7.5 | 10.0 | 10.0 | 3.70 | 120 | 30 | .30 | 5.0 | 140 | 6500 | 1 | 1 | 111 |
| 7.5 | 7.5 | 7.5 | 4.00 | 120 | 30 | 2.5 | 150 | 6500 | 1 | 1 | 111 | |
| | | | | | .40 | | | | | | | |
| 7.5 | 7.5 | 7.5 | 4.00 | 140 | 50 | | | 210 | 6500 | 1 | 1 | 111 |
| 7.5 | 10.0 | 10.0 | 3.70 | 120 | 50 | .15 | 2.5 | 210 | 6500 | 1 | 1 | 111 |
| 7.5 | 10.0 | 5.0 | 4.25 | 80 | 50 | .40 | 1.0 | 350 | 6500 | 1 | 1 | 111 |
| 7.5 | 10.0 | 10.0 | 3.90 | 120 | 70 | | | 400 | 6500 | 1 | 1 | 111 |
| 7.5 | 10.0 | 10.0 | 3.90 | 120 | 70 | .30 | 1.0 | 410 | 6500 | 1 | 1 | 111 |
| 7.5 | 10.0 | 10.0 | 4.10 | 120 | 70 | .30 | 1.0 | 550 | 6500 | 1 | 1 | 111 |
| 7.5 | 10.0 | 10.0 | 4.10 | 100 | 50 | .15 | 1.0 | 530 | 6500 | 1 | 1 | 112 |
| 7.5 | 10.0 | 10.0 | 4.10 | 120 | 50 | | | 580 | 6500 | 1 | 1 | 112 |
| 7.5 | 10.0 | 10.0 | 3.50 | 120 | 70 | .35 | 1.0 | 130 | 6600 | 1 | 1 | 111 |
| 7.5 | 10.0 | 5.0 | 4.25 | 80 | 50 | | | 260 | 6600 | 1 | 1 | 111 |
| 7.5 | 7.5 | 10.0 | 4.10 | 100 | 50 | | | 450 | 6600 | 1 | 1 | 111 |
| 7.5 | 10.0 | 5.0 | 4.25 | 100 | 30 | .40 | 1.0 | 460 | 6600 | 1 | 1 | 111 |
| 7.5 | 10.0 | 5.0 | 4.25 | 120 | 50 | | | 490 | 6600 | 1 | 1 | 111 |
| 7.5 | 7.5 | 10.0 | 4.10 | 100 | 30 | | | 530 | 6600 | 1 | 1 | 111 |
| 7.5 | 10.0 | 10.0 | 4.10 | 120 | 70 | | | 550 | 6600 | 1 | 1 | 111 |
| 7.5 | 10.0 | 10.0 | 3.50 | 140 | 70 | .30 | 1.0 | 120 | 6700 | 1 | 1 | 111 |
| 7.5 | 10.0 | 5.0 | 4.25 | 100 | 50 | .40 | 1.0 | 410 | 6700 | 1 | 1 | 111 |
| 7.5 | 7.5 | 10.0 | 4.10 | 120 | 50 | | | 560 | 6800 | 1 | 1 | 111 |
| 7.5 | 7.5 | 7.5 | 4.25 | 120 | 20 | | | 380 | 6900 | 1 | 1 | 111 |
| 7.5 | 10.0 | 5.0 | 4.25 | 100 | 50 | | | 430 | 6900 | 1 | 1 | 111 |
| 7.5 | 7.5 | 10.0 | 4.10 | 120 | 70 | | | 510 | 6900 | 1 | 1 | 111 |
| 7.5 | 10.0 | 10.0 | 3.70 | 120 | 50 | .15 | 1.0 | 180 | 7000 | 1 | 1 | 111 |
| 7.5 | 7.5 | 7.5 | 4.00 | 120 | 50 | .10 | 1.0 | 170 | 7300 | 1 | 1 | 111 |

APPENDIX-continued

TABLE I

| TKNS | ELECTROLYTE | | | CURRENT | | | | HYSTER. PROP. | | LOOP ANALYSIS | | |
|---|---|---|---|---|---|---|---|---|---|---|---|---|
| | CO | ADD. | PH | T | CD | P | PD | HC | BY | A | P | L |
| 7.5 | 7.5 | 7.5 | 4.00 | 120 | 70 | .10 | 1.0 | 150 | 7500 | 1 | 1 | 111 |

What is claimed is:

1. An aqueous electrolytic plating solution comprising:

cobaltous ion in the range of from about 3 to about 15 grams per liter;

nickelous ion in the range of from about 30 to about 50 grams per liter, the ratio of nickelous ion to cobaltous ion being in the range of from about 3:1 to about 15:1; and orthophosphite ion in the range of from about 3 to about 12 grams per liter;

said solution having a pH in the range of from about 3.5 to about 4.7 and being substantially free of hypophosphite ion, copper and iron.

2. An electrolytic plating solution as defined in claim 1 further comprising a negative ion selected from the group of sulfate ion and chloride ion in a concentration at least stoichiometric with the cobaltous and nickelous ions and up to about 10 grams per liter in excess of stoichiometric.

3. An electrolytic plating solution as defined in claim 1 further comprising sulfate ion in the range of from an amount stoichiometric with the cobaltous and nickelous ions up to about 10 grams per liter above stoichiometric.

4. An electrolytic plating solution as defined in claim 3 further comprising at least some boric acid cathode buffer up to about 30 grams of boric acid per liter and at least some formate ion pH buffer up to about 25 grams of formate ion per liter.

5. An electrolytic plating solution as defined in claim 1 further comprising at least some boric acid cathode buffer up to about 30 grams of boric acid per liter and at least some formate ion pH buffer up to about 25 grams of formate ion per liter.

6. An electrolytic plating solution as defined in claim 1 wherein the orthophosphite ion concentration is in the range of from about 7 to about 9 grams per liter.

7. An electrolytic plating solution as defined in claim 6 wherein the pH is in the range of from about 4 to about 4.5.

8. An electrolytic plating solution as defined in claim 1 wherein the cobaltous ion concentration is in the range of from about 5 to about 10 grams per liter and the ratio of nickelous ions to cobaltous ions is in the range of from about 4:1 to about 10:1.

9. An electrolytic plating solution as defined in claim 8 wherein the orthophosphite ion concentration is in the range of from about 7 to about 9 grams per liter and the pH is in the range of from about 4.0 to about 4.5.

10. An electrolytic plating solution as defined in claim 1 having no more than about 5 grams per liter of phosphate ion.

11. An aqueous electrolytic plating solution for electrodeposition of ferromagnetic alloys consisting essentially of:

cobaltous sulfate in the range of from about 3 to about 15 grams of cobaltous ion per liter;

nickelous sulfate in the range of from about 30 to about 50 grams of nickelous ion per liter, the ratio of nickelous ion to cobaltous ion being in the range of from about 3:1 to about 15:1; and orthophosphite ion in the range of from about 3 to about 12 grams per liter;

said solution having a pH in the range of from about 3.5 to about 4.7.

12. An aqueous electrolytic plating solution as defined in claim 11 further consisting essentially of:

at least some formate ion pH buffer up to about 25 grams of formate ion per liter; and at least some boric acid cathode buffer up to about 30 grams of boric acid per liter.

13. An electrolytic plating solution as defined in claim 11 wherein the cobaltous ion is present in the range of from about 5 to about 10 grams per liter and the ratio of nickelous ion to cobaltous ion is in the range of from about 4:1 to about 10:1.

14. An electrolytic plating solution as defined in claim 13 wherein the orthophosphite ion is present in the range of from about 7 to about 9 grams per liter; the solution is substantially free of hypophosphite ion, iron, and copper.

15. A process for depositing a ferromagnetic recording film on an electrically conductive substrate comprising passing a plating current in the range of from about 10 to about 120 amperes per square foot through the substrate as a cathode in an aqueous electrolyte at a temperature in the range of from about 70 to about 140° F; said electrolyte having a pH in the range of from about 3.5 to about 4.7 and comprising cobaltous ion in the range of from about 3 to about 15 grams per liter; nickelous ion in the range of from about 30 to about 50 grams per liter, the ratio of nickelous ion to cobaltous ion being in the range of from about 3:1 to about 15:1; and orthophosphite ion in the range of from about 3 to about 12 grams per liter; and being substantially free of hypophosphite ion, copper and iron.

16. A process as defined in claim 15 wherein the electrolyte further comprises a quantity of negative ion selected from the group of sulfate ion and chloride ion in a concentration at least stoichiometric with the cobaltous and nickelous ions and up to about 10 grams per liter in excess of stoichiometric.

17. A process as defined in claim 15 wherein the electrolyte further comprises sulfate ion in the range of from an amount stoichiometric with the cobaltous and nickelous ions up to about 10 grams per liter above stoichiometric.

18. A process as defined in claim 17 wherein the electrolyte further comprises at least some boric acid cathode buffer up to about 30 grams of boric acid per liter and at least some formate ion pH buffer up to about 25 grams of formate ion per liter.

19. A process as defined in claim 15 wherein the orthophosphite ion concentration in the electrolyte is in the range of from about 7 to about 9 grams per liter.

20. A process as defined in claim 19 wherein the pH is maintained in the range of from about 4 to about 4.5.

21. A process as defined in claim 15 wherein the cobaltous ion concentration in the electrolyte is in the range of from about 5 to about 10 grams per liter and the ratio of nickelous ions to cobaltous ions is in the range of from about 4:1 to about 10:1.

22. A process as defined in claim 21 wherein the orthophosphite ion concentration in the electrolyte is in the range of from about 7 to about 9 grams per liter and the pH is in the range of from about 4.0 to about 4.5.

23. A process as defined in claim 22 wherein the plating current is passed in pulses in the range of from about 1.5 to about 40 ampere-seconds per square foot with a time interval in the range of from about 1 to about 5 seconds between pulses.

24. A process as defined in claim 15 wherein the electrolyte has no more than about 5 grams per liter of phosphate ion.

25. A process as defined in claim 15 further comprising continuing the passing step until a thickness of recording film in the range of from about 5 to about 25 microinches is deposited.

26. A process for depositing a ferromagnetic recording film as defined in claim 15 wherein the plating current is continuously passed until the entire thickness of recording film is deposited.

27. A process for depositing a ferromagnetic recording film as defined in claim 15 wherein the plating current is passed in pulses in the range of from about 1.5 to about 40 ampere-seconds per square foot with a time interval in the range of from about 1 to about 5 seconds between pulses.

28. An article comprising a structure having therein a ferromagnetic coating having a coercivity in the range of from about 90 to about 800 oersteds, a retentivity in the range of from about 1000 to 7500 gauss, and a hysteresis loop having an essentially vertical side and a knee radius $R_2$ less than about 1/16 inch on a scale wherein 1½ inch equals about 1000 oersteds and 1½ inch equals about 10,000 gauss, and deposited according to the process of claim 15.

29. A process for depositing a ferromagnetic recording film on an electrically conductive substrate comprising passing a plating current in the range of from about 10 to about 120 amperes per square foot through the substrate as a cathode in an aqueous electrolyte at a temperature in the range of from about 70° to 140° F, said electrolyte having a pH in the range of from about 3.5 to about 4.7 and consisting essentially of cobaltous sulfate in the range of from about 3 to about 15 grams of cobaltous ion per liter; nickelous sulfate in the range of from about 30 to 50 grams of nickelous ion per liter, the ratio of nickelous ion to cobaltous ion being in the range of from about 3:1 to about 15:1; and orthophosphite ion in the range of from about 3 to about 12 grams per liter.

30. A process as defined in claim 29 wherein the electrolyte further consists essentially of:

at least some formate ion pH buffer up to about 25 grams of formate ion per liter; and at least some boric acid cathode buffer up to about 30 grams of boric acid per liter; and wherein said electrolyte has a pH in the range of from about 3.5 to about 4.7.

31. A process as defined in claim 29 wherein the cobaltous ion is present in the electrolyte in the range of from about 5 to about 10 grams per liter and the ratio of nickelous ion to cobaltous ion is in the range of from about 4:1 to about 10:1.

32. A process as defined in claim 31 wherein the orthophosphite ion is present in the electrolyte in the range of from about 7 to about 9 grams per liter; the electrolyte is substantially free of hypophosphite ion, iron and copper; and the pH of the electrolyte is in the range of from about 3.5 to about 4.7.

33. A process as defined in claim 29 wherein the plating current is passed in pulses in the range of from about 1.5 to about 40 ampere-seconds per square foot with a time interval in the range of from about 1 to about 5 seconds between pulses.

* * * * *

UNITED STATES PATENT AND TRADEMARK OFFICE

CERTIFICATE OF CORRECTION

PATENT NO. : 3,950,234

DATED : April 13, 1976

INVENTOR(S) :

It is certified that error appears in the above-identified patent and that said Letters Patent are hereby corrected as shown below:

Column 4, Line 7, "rear" should be -- read --.

Column 5, Line 29, "Hdb" should be -- $\int$ Hdb --.

Column 7, Line 28, "for" should be -- of --.

Column 11, Line 5, "60000" should be -- 6000 --.

Column 12, Line 66, "commrcial" should be -- commercial --.

Column 40, Line 32, -- and -- should be inserted after "liter" and before "the"

Column 41, Line 36 "therein" should be -- thereon --.

Signed and Sealed this

Twenty-seventh Day of July 1976

[SEAL]

*Attest:*

RUTH C. MASON
*Attesting Officer*

C. MARSHALL DANN
*Commissioner of Patents and Trademarks*